United States Patent
Pierrat et al.

(10) Patent No.: US 7,083,879 B2
(45) Date of Patent: *Aug. 1, 2006

(54) PHASE CONFLICT RESOLUTION FOR PHOTOLITHOGRAPHIC MASKS

(75) Inventors: Christophe Pierrat, Santa Clara, CA (US); Michel Luc Côté, San Jose, CA (US)

(73) Assignee: Synopsys, Inc., Mountain View, CA (US)

(*) Notice: Subject to any disclaimer, the term of this patent is extended or adjusted under 35 U.S.C. 154(b) by 97 days.

This patent is subject to a terminal disclaimer.

(21) Appl. No.: 09/932,239

(22) Filed: Aug. 17, 2001

(65) Prior Publication Data

US 2002/0197543 A1 Dec. 26, 2002

Related U.S. Application Data

(60) Provisional application No. 60/296,788, filed on Jun. 8, 2001, and provisional application No. 60/304,142, filed on Jul. 10, 2001.

(51) Int. Cl.
*G03F 9/00* (2006.01)
*G06F 17/50* (2006.01)

(52) U.S. Cl. ................. 430/5; 430/30; 716/19
(58) Field of Classification Search ............. 430/5, 430/22, 30; 378/35; 716/19
See application file for complete search history.

(56) References Cited

U.S. PATENT DOCUMENTS

| | | | |
|---|---|---|---|
| 4,037,918 A | 7/1977 | Kato | 350/3.5 |
| 4,456,371 A | 6/1984 | Lin | 355/71 |
| 5,302,477 A | 4/1994 | Dao et al. | 430/5 |
| 5,308,741 A | 5/1994 | Kemp | 430/312 |

(Continued)

FOREIGN PATENT DOCUMENTS

| | | |
|---|---|---|
| DE | 195 45 163 A1 | 6/1996 |
| EP | 0 464 492 A1 | 1/1992 |
| EP | 0 653 679 A2 | 5/1995 |

(Continued)

OTHER PUBLICATIONS

Sakata, Miwa, et al., "A Novel Radiaion Sensitive Spin-on-glass Convertible into SiO2 and the Simple Fabrication Process Using It," Jul. 26, 1993* (*ATI Bell Labs fax date), 3 pages.

Pistor, Thomas V., "Rigorous 3D Simulation of Phase Defects in Alternating Phase–Shifting Masks," Proceedings of SPIE 4562–1038 (Mar. 2002), 13 pages.

(Continued)

*Primary Examiner*—Mark F. Huff
*Assistant Examiner*—Saleha Mohamedulla
(74) *Attorney, Agent, or Firm*—Haynes Beffel & Wolfeld LLP

(57) ABSTRACT

A photolithographic mask used for defining a layer in an integrated circuit, or other work piece, where the layer comprises a pattern including a plurality of features to be implemented with phase shifting in phase shift regions is laid out including for patterns comprising high density, small dimension features, and for "full shift" patterns. The method includes identifying cutting areas for phase shift regions based on characteristics of the pattern. Next, the process cuts the phase shift regions in selected ones of the cutting areas to define phase shift windows, and assigns phase values to the phase shift windows. The phase shift values assigned comprise φ and θ, so that destructive interference is caused in transitions between adjacent phase shift windows having respective phase shift values of φ and θ. In the preferred embodiment, φ is equal to approximately θ+180 degrees. Results of the cutting and assigning steps are stored in a computer readable medium, used for manufacturing a mask, and used for manufacturing an integrated circuit. By identifying the cutting areas based on characteristics of the pattern to be formed, the problem of dividing phase shift regions into phase shift windows, and assigning phase shift values to the windows is simplified.

48 Claims, 15 Drawing Sheets

U.S. PATENT DOCUMENTS

| | | | |
|---|---|---|---|
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B1 | 7/2002 | Wang et al. | 430/5 |
| 6,436,590 B1 | 8/2002 | Wang et al. | 430/5 |
| 6,733,929 B1 * | 5/2004 | Pierrat | 430/5 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0122994 A1 | 9/2002 | Cote et al. | 430/5 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| EP | 0 698 821 | 2/1996 |
| GB | 2333613 | 7/1999 |
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Ogawa, Kiyoshi, et al., "Phase Defect Inspection by Differential Interference," Proceedings of SPIE 4409–71, Apr. 26, 2001, 12 pages.

Rhyins, P., et al., "Characterization of Quartz Etched PSM Masks for KrF Lithography at the 100 nm node," Proceedings of SPIE 4562 (Mar. 2002), 486–495.

Sewell, Harry, et al., "An Evaluation of the Dual Exposure Technique," (As early as 2002*), 11 pages* The date is based on references 8&9 of the article of Feb. 16, 2001 and Feb. 27, 2002, respectively.

Wang, Ruoping, et al., "Polarized Phase Shift Mask: Concept, Design, and Potential Advantages to Photolithography Process and Physical Design," Proceedings of SPIE 4754–105, Apr. 25, 2002, 12 pages.

Matsuoka, et al., "Application of Alternating Phase–Shifting Mask to 0.16um CMOS Logic Gate Patterns," SPIE Proc. 3051, Mar. 10–14, 1997, 10 pages.

Semmier, Armin, et al., "Application of 3D EMF Simulation for Development and Optimization of Alternating Phase Shifting Masks," Proc. of SPIE 4346–37, Mar. 1, 2001, 12 pages.

Wong, Alfred K., "Polarization Effects in Mask Transmission," Proc. of SPIE 1674, Mar. 8, 1992, 8 pages.

Ackmann, Paul, et al., "Phase Shifting and Optical Proximity Corrections to improve CD control on Logic Devices in Manufacturing for sub 0.35 um I–Line," Proc. of SPIE 3051–07, Mar. 1997, 8 pages.

Spence, C., et al., "Detection of 60 degree Phase defects on Alternating PSMs," Proc. of SPIE 3412–73, Apr. 1998, 2 pages.

Sugawara, Minoru, et al., "Defect printability study of attenuated phase–shifting masks for specifying inspection sensitivity," Proc. SPIE 2621–49, Sep. 1995, 16 pages.

Schmidt, Regina, et al., "Impact of Coma on CD Control for Multiphase PSM Designs," Proc. SPIE 3334–02, Feb. 1998, 11 pages.

Erdmann, Andreas, "Topography effects and wave aberrations in advanced PSM–technology," Proc. SPIE 4346–36, Mar. 1, 2001, 28 pages.

Granik, Yuri et al., "CD variation analysis technique and its application to the study of PSM mask misalignment," Proc. SPIE 4186–94, Sep. 2000, 9 pages.

Ishiwata, Naoyuki, et al., "Fabrication of Phase–Shifting Mask," Proc. SPIE 1463, Mar. 1991, 11 pages.

Levenson, Marc D., et al., "Phase Phirst! An improved strong–PSM paradigm," Proc. SPIE 4186–42, Sep. 2000, 10 pages.

Levenson, Marc. D., et al., "SCAA mask exposures and Phase Phirst design for 110nm and below," Proc. SPIE 4346–817, Sep. 2001, 10 pages.

Morikawa, Yasutaka, et al., "100nm–Alt.PSM structure discussion for ArF lithography," Proc. SPIE 4409–22, Apr. 2001, 15 pages.

Ozaki, T., et al., "A 0.15 um KrF Lithography for 1Gb DRAM Product using Highly Printable Patterns and Thin Resist Process," 1998 Symposium on VLSI Technology, Jun. 1998, Honolulu, Hawaii, 2 pages.

Ronse, Kurt, et al., "Comparison of various phase shift strategies and application of 0.35 um ASIC designs," Proc. SPIE 1927, 1993, 15 pages.

Rosenbluth, Alan E., et al., "Optimum Mask and Source Patterns to Print a Given Shape," Proc. SPIE 4346–49, Mar. 1, 2001, 17 pages.

Suzuki, Akiyoshi, et al., "Multilevel imaging system realizing k1=0.3 lithography," Proc. SPIE 3679–36, Mar. 1999, 13 pages.

Vandenberghe, G., et al., "(Sub–) 100nm gate patterning using 248nm alternating PSM," Mentor Graphics White Paper, May 2001, 9 pages.

Fritze, M., et al., "100–nm Node Lithography With KrF?" Feb. 1, 2001, 14 pages.

Fukuda, Hiroshi, et al., "Patterning of Random Interconnect Using Double Exposure of Strong–Type PSMs," Proc. SPIE 4346–695, Sep. 2001, 8 pages.

Ferguson, Richard A., et al., "Pattern–Dependent Correction of Mask Topography Effects for Alternating Phase–Shifting Masks," Proc. SPIE 2440–349, May 1995, 12 pages.

Toublan, Olivier, et al., "Phase and Transmission Errors Aware OPC Solution for PSM: Feasibility Demonstration," Proc. SPIE 4186–95, Sep. 13, 2000, 7 pages.

Yanagishita, Yuichiro, et al., "Phase–Shifting Photolithography Applicable to Real IC Patterns," Proc. SPIE 1463, Mar. 3, 1991, 11 pages.

Pierrat, C., "Investigation of Proximity Effects in Alternating Aperture Phase Shifting Masks," Sep. 2000, 11 pages.

Cote, Michel, et al., "A Practical Application of Full–Feature Alternating Phase–Shifting Technology for a Phase–Aware Standard–Cell Design Flow," Jun. 1, 2001, 6 pages.

Hanyu, Isamu, et al., "New phase–shifting mask with highly transparent SiO2 phase shifters," Proc. SPIE 1264–167, Jun. 1990, pp. 166–177.

McCallum, Martin, et al., "Alternating PSM Mask Performance—A Study of Multiple Fabrication Technique Results," Proc. SPIE 4346–723, Sep. 2001, 6 pages.

Hidetoshi Ohnuma et al. "Automatic Alternative Phase Shift Mask CAD Layout Tool for Gate Shrinkage of Embedded DRAM in Logic Below 0.18μm" Photomask and X–Ray Mask Technology Y Kawasaki, Japan Apr. 1998, pp. 206–213.

Andrew B. Kahng et al. "New Graph Bipartizations for Double–Exposure, Bright Field Alternating Phase–Shift Mask Layout" Asia and South Pacific Design Automation Conference Jan. 2001, pp. 133–138.

Piotr Berman et al. "Optimal Phase Conflict Removal for Layout of Dark Field Alternating Phase Shifting Masks" IEEE Transactions on Computer Aided Design of Integrated Circuits and Systems, IEEE Inc. New York Feb. 2000, pp. 175–187.

Cooke, M., "OPC/PSM Designs For Poly Gate Layers". European Semiconductor, vol. 22, No. 7, pp. 57–59, Jul. 2000.

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

Wang, R., et al., "Polarized Phase Shift Mask: Concept, Design, and Potential Advantages to Photolithography Process and Physical Design", Motorola Semiconductor Product Sector (12 pages).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B. pp. 2991–2997, Nov. 1991.

Inoue. S., et al., "Simulation Study on Phase–Shifting Masks for Isolated Patterns", Japanese Journal of Applied Physics, vol. 30, No. 11B. pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Moniwa, A., et al., "Algorithm for Phase–Shift Mask Design with Priority on Shifter Placement", Jpn. J. Appl. Phys., vol. 32. Pt. 1, No. 12B, pp. 5874–5879, Dec. 1993.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol B., vol. 11, No. 6, pp. 2665–2668, Nov./Dec. 1993.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceeding of SPIE, vol. 4000, pp. 121–131 (2000).

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Terasawa, T., et al., "0.3–Micron Optical Lithography Using a Phase–Shifting Mask", SPIE, Optical/Laser Microlithography II, vol. 1088, pp. 25–33, Mar. 1989.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self-–Aligned Phase Sifters for a Quarter Micron Photolithography", IEDM, pp. 3.3.1–3.3.4, Dec. 3–6, 1989.

Jinbo, H., et al., "0.2 um or Less i–Line Lithography by Phase–Shifting–Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9 um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photomask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Asai, S., et al., "High Performance Optical Lithography Using a Separated Light Source", J. Vac. Sci. Technol. B, vol. 10, No. 6, pp. 3023–3026, Nov./Dec. 1992.

Jinbo, H., et al., "Application of Blind Method to Phase–Shifting Lithography", IEEE, 1992 Symposium On VLSI Technology Digest Of Technical Papers, pp. 112–113 (1992).

Ohtsuka, H., et al., "Phase Defect Repair Method for Alternating Phase Shift Masks Conjugate Twin–Shifter Method", Jpn. J. Appl. Phys., vol. 31, pp. 4143–4149 (1992).

Pierrat, C., et al., "Phase–Shifting Mask Topography Effects on Lithographic Image Quality", IEEE, pp. 3.3.1–3.3.4 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Burggraaf, P., "Lithography's Leading Edge, Part 1: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Brunner, T., "Rim Phase–Shift Mask Combined with Off–Axis Illumination: A Path to 0.5(lampda) / Numerical Aperture Geometrics", Optical Engineering, vol. 32, No. 10, pp. 2337–2343, Oct. 1993.

Lin, B.J., "Phase–Shifting Masks Gain an Edge", IEEE Circuits & Devices, pp. 28–35, Mar. 1993.

Liu, H.Y., et al., "Fabrication of 0.1um T–Shaped Gates by Phase–Shifting Optical Lithography", SPIE, Optical/Laser Microlithography VI, vol. 1927, pp. 42–52 (1993).

Nistler, J., et al., "Phase Shift Mask Defect Printability Analysis", Proceedings Of The Microlithography Seminar INTERFACE '93, OCG Microelectronic Materials, Inc., pp. 11–28 (1993).

Rieger, M., et al., "system for Lithography Proximity Compensation", Precim Company, Portland, Oregon, Sep. 1993 (28 pages).

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Maskmaking and its Application", J. Vac. Sci. Technol. B, vol. 11, No. 6, pp. 2669–2674, Nov./Dec. 1993.

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Nistler, J., et al., "Large Area Optical Design Rule Checker for Logic PSM Application", SPIE, Photomask And X–Ray Mask Technology, vol. 2254, pp. 78–92 (1994).

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Pierrat, C., et al., "A Rule–Based Approach to E–Beam and Process–Induced Proximity Effect Correction for Phase–Shifting Mask Fabrication", SPIE, vol. 2194, pp. 298–309 (1994).

Spence, C., et al., "Automated Determination of CAD Layout Failures Through Focus: Experiment and Simulation", SPIE, vol. 2197, pp. 302–313 (1994).

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Karklin, L., "A Comprehensive Simulation Study of the Photomask Defects Printability", SPIE, vol. 2621, pp. 490–504 (1995).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al, "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243–249 (1997).

Morimoto, H., et al., "Next Generation Mask Strategy—Technologies are Ready for Mass Production of 256MDRAM?", SPIE, vol. 3236, pp. 188–189 (1997).

Roman, B., et al., "Implications of Device Processing on Photomask CD Requirements", SPIE, vol. 3236 (1997) (Abstract Only).

Ishida, S., et al., "Large Assist Feature Phase–Shift Mask for Sub–Quarter Micrometer Wndow Pattern Formation", SPIE, vol. 3096, pp. 333–343 (1997).

Nakae, A., et al., "A Proprosal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Fukuda, H., et al., "Determination of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Naofabrication Abstracts, pp. 18–19, May 30–Jun. 1999.

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

* cited by examiner

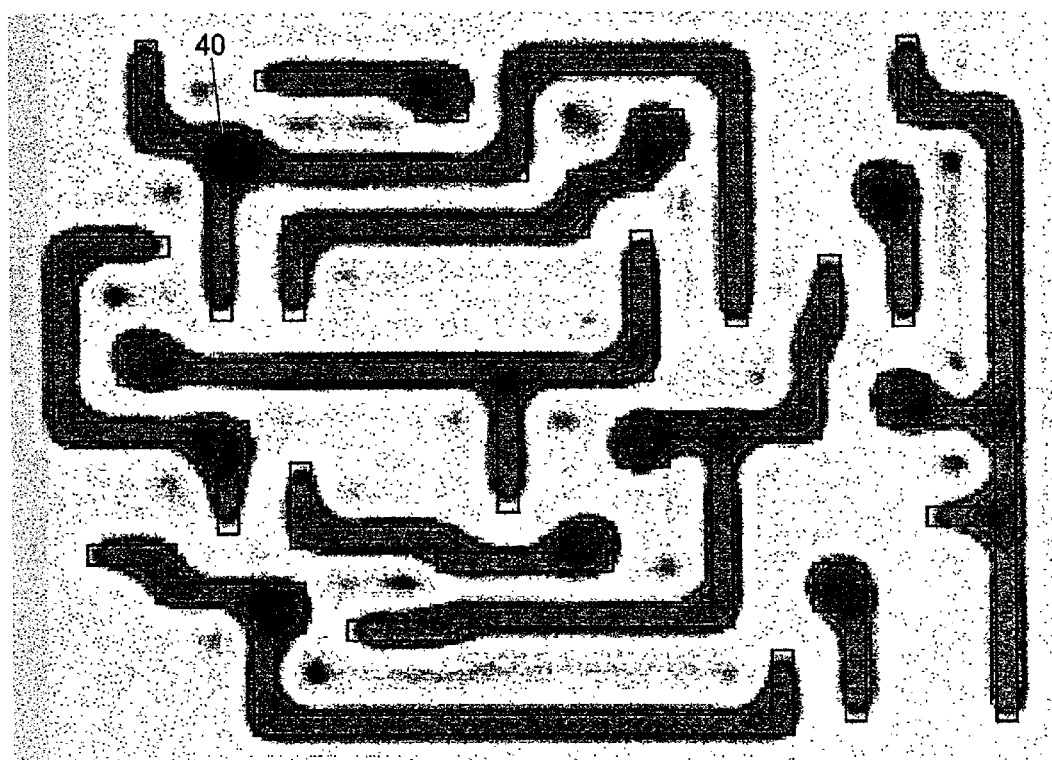
FIG. 5
FIG. 6
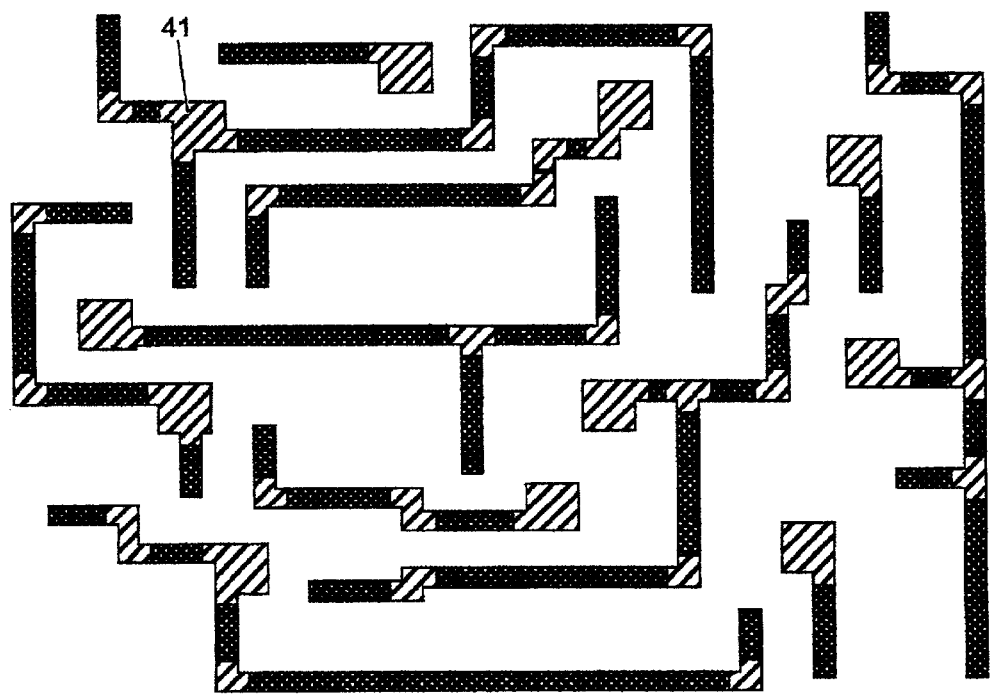

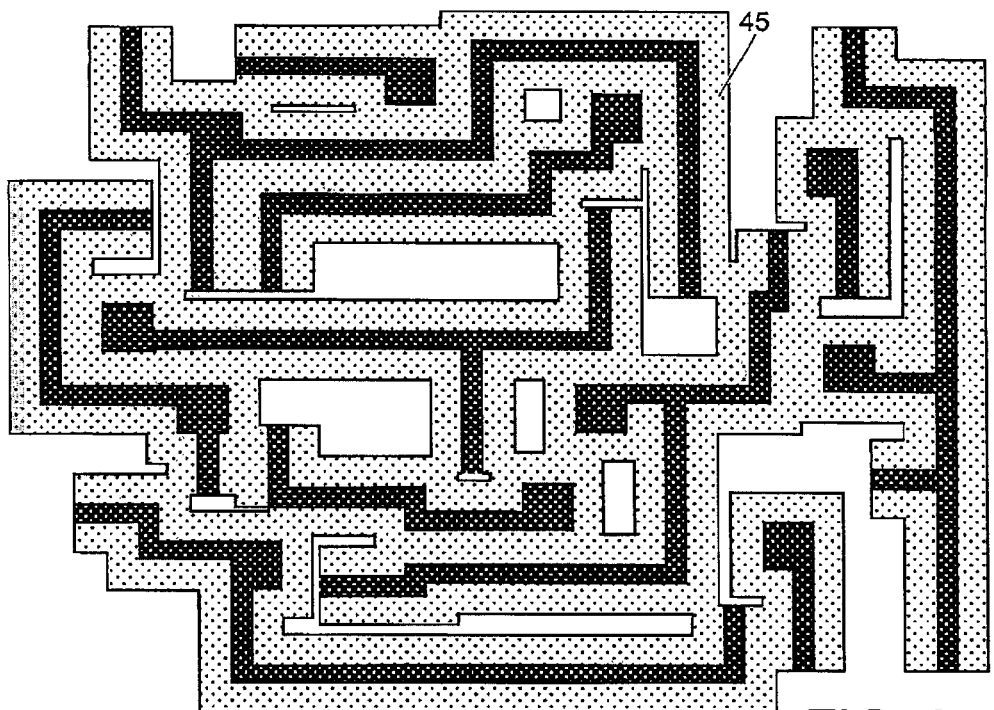
FIG. 9
FIG. 10
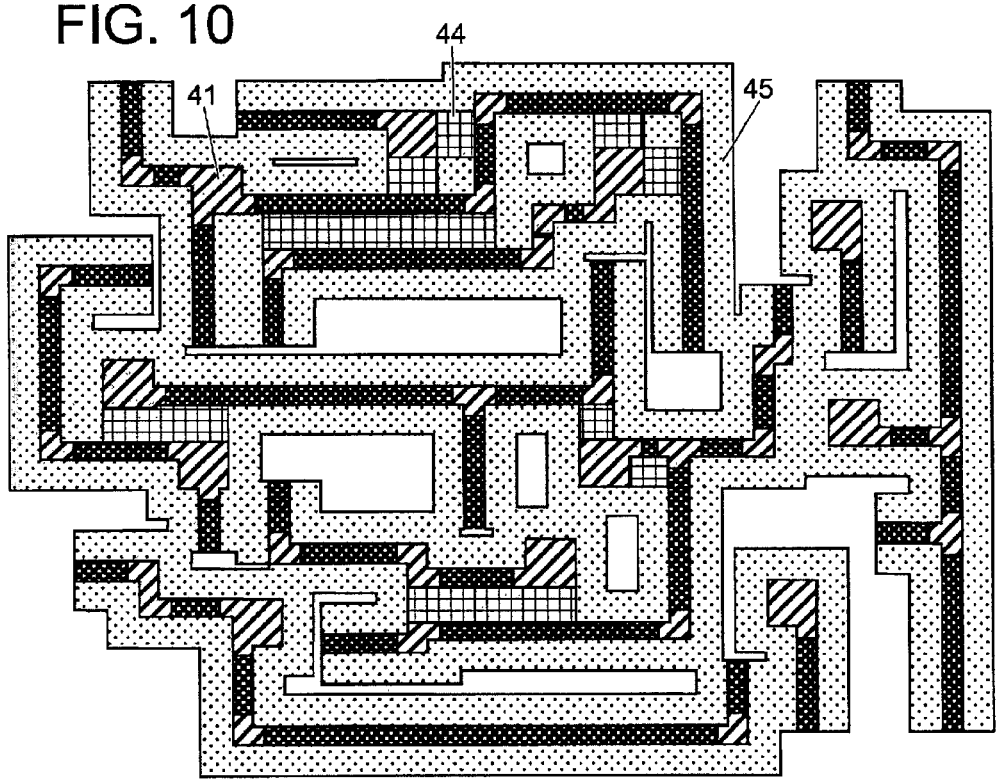

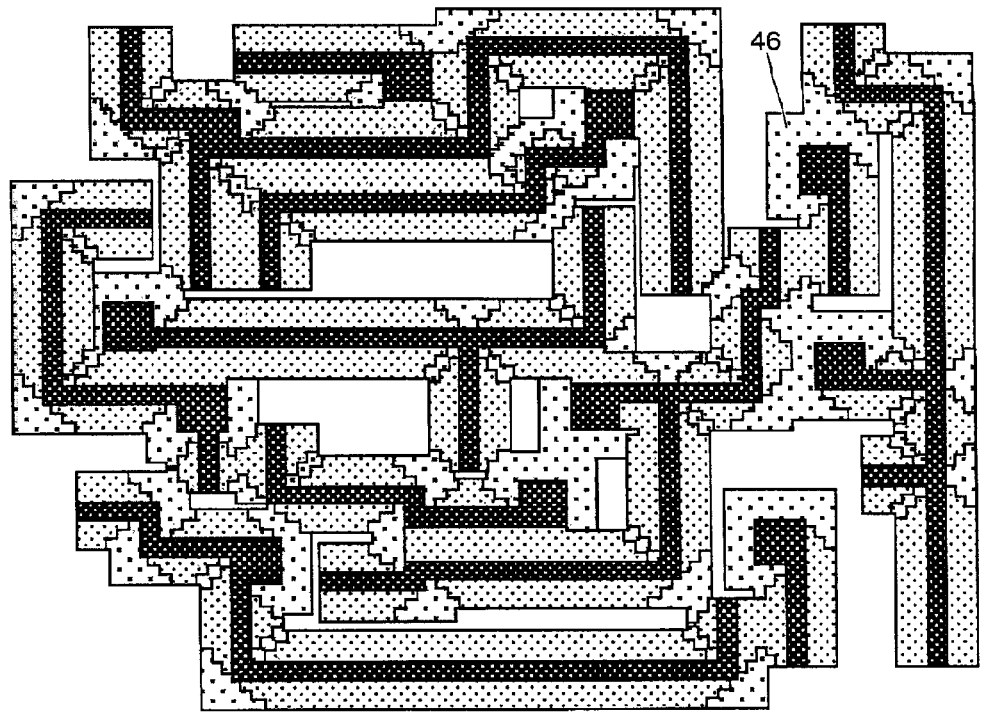
FIG. 11
FIG. 12
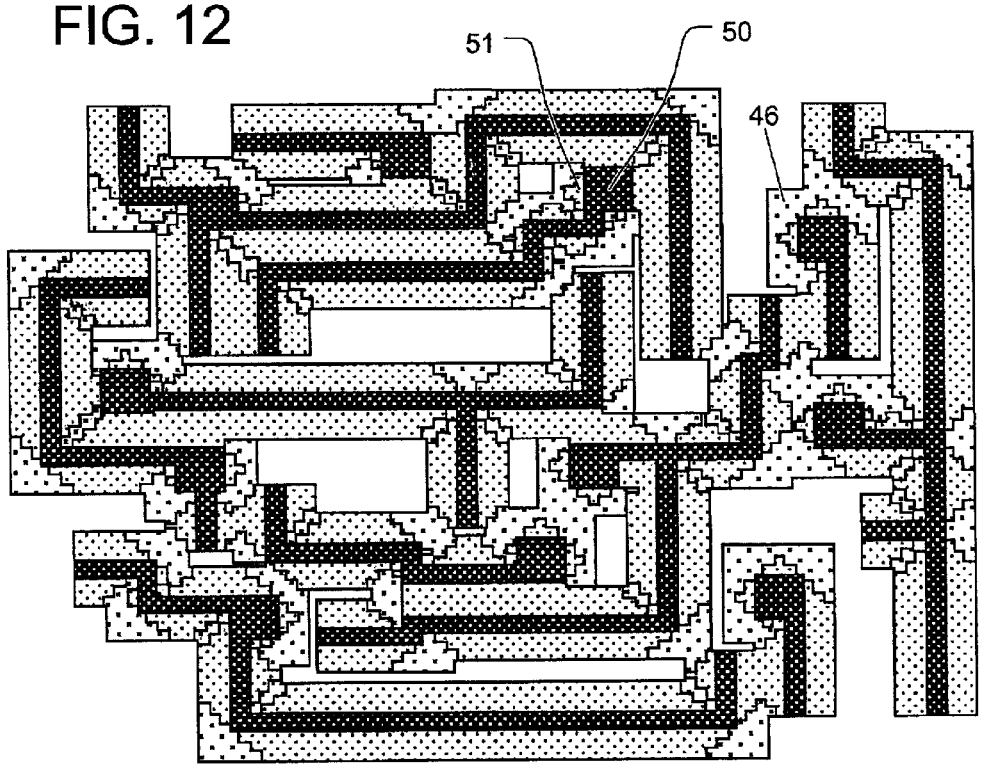

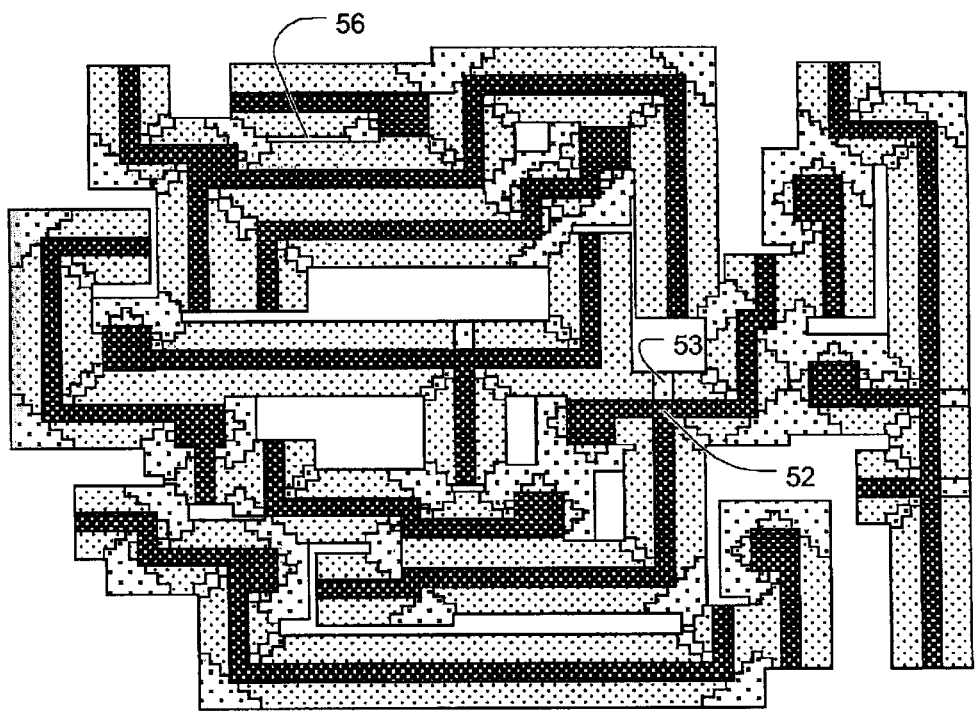
FIG. 13
FIG. 14
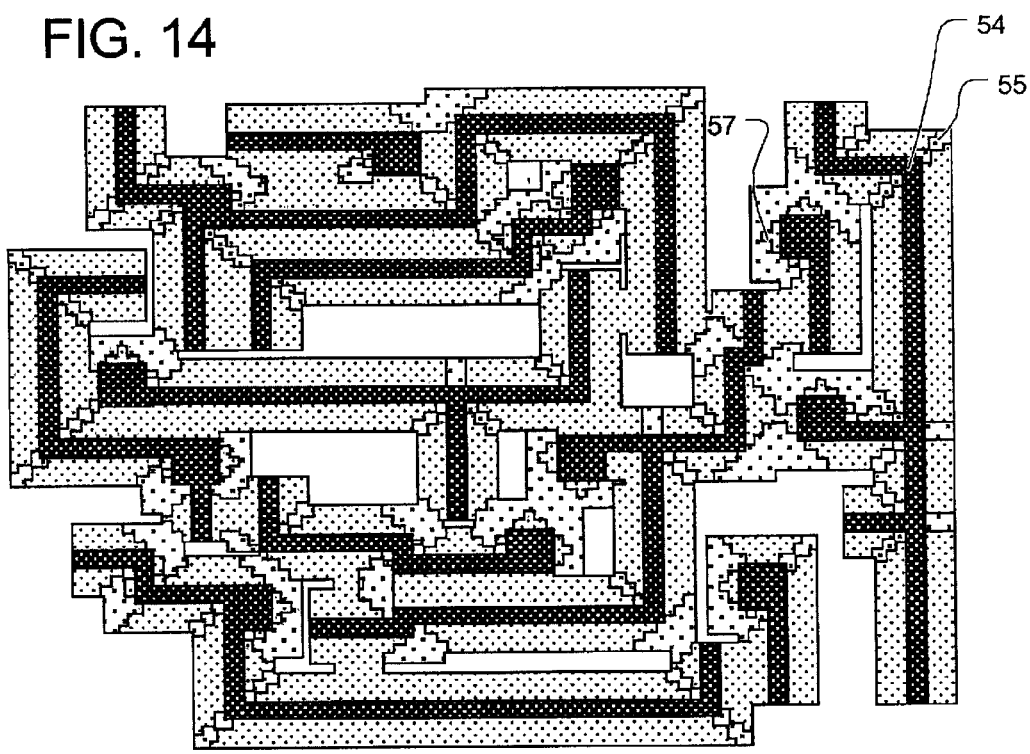

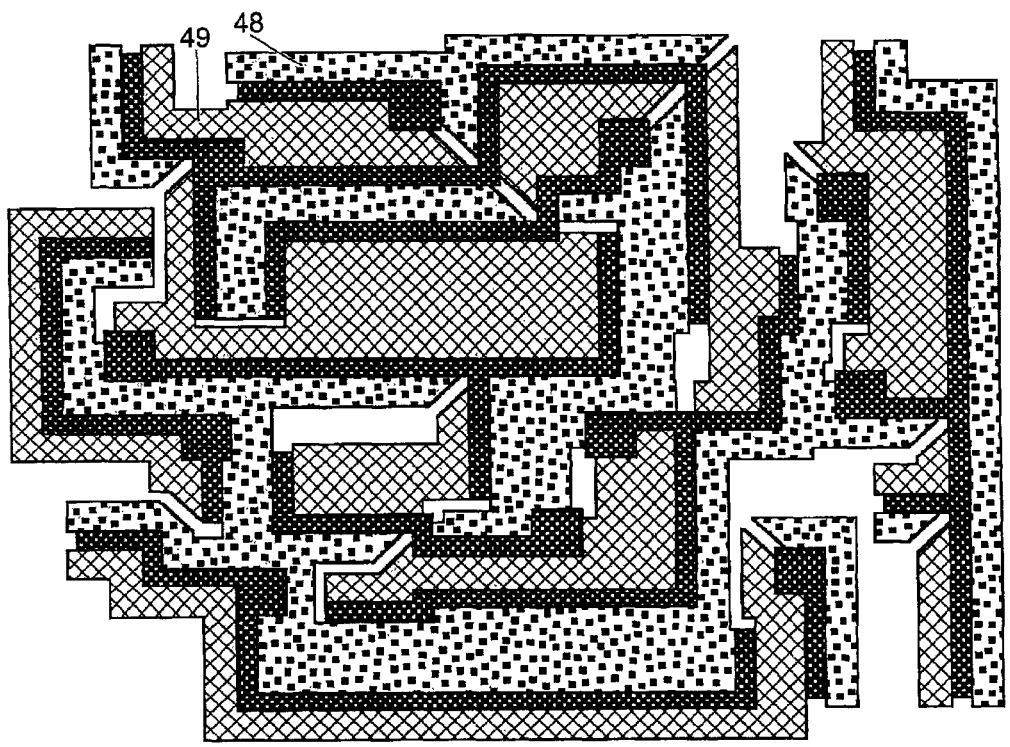
FIG. 16
FIG. 17
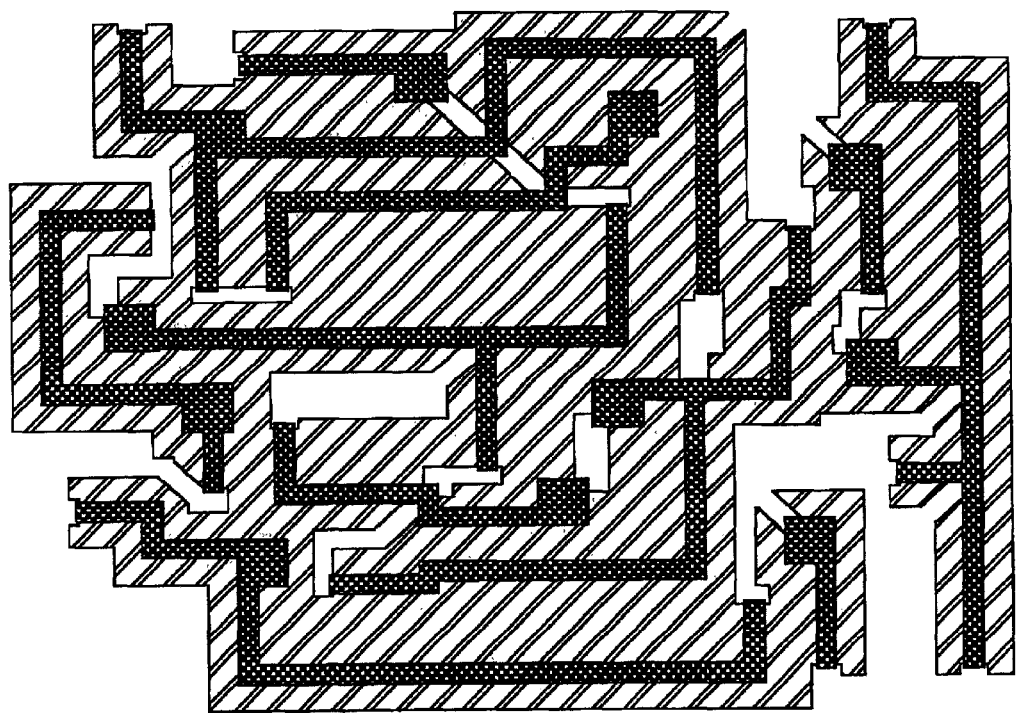

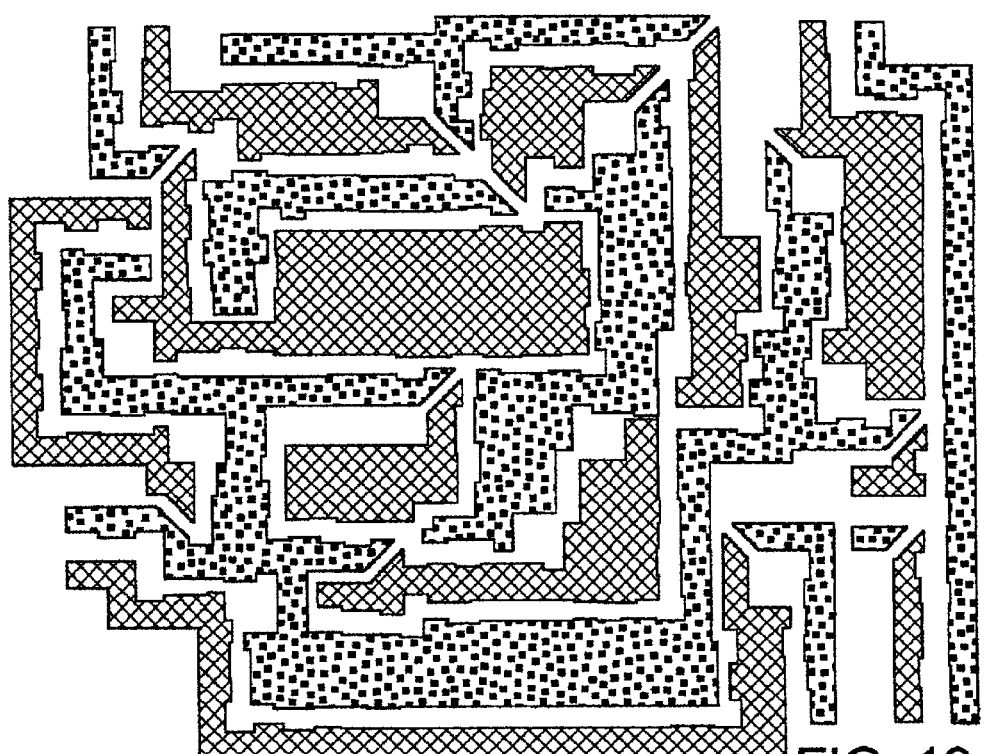
FIG. 19
FIG. 20
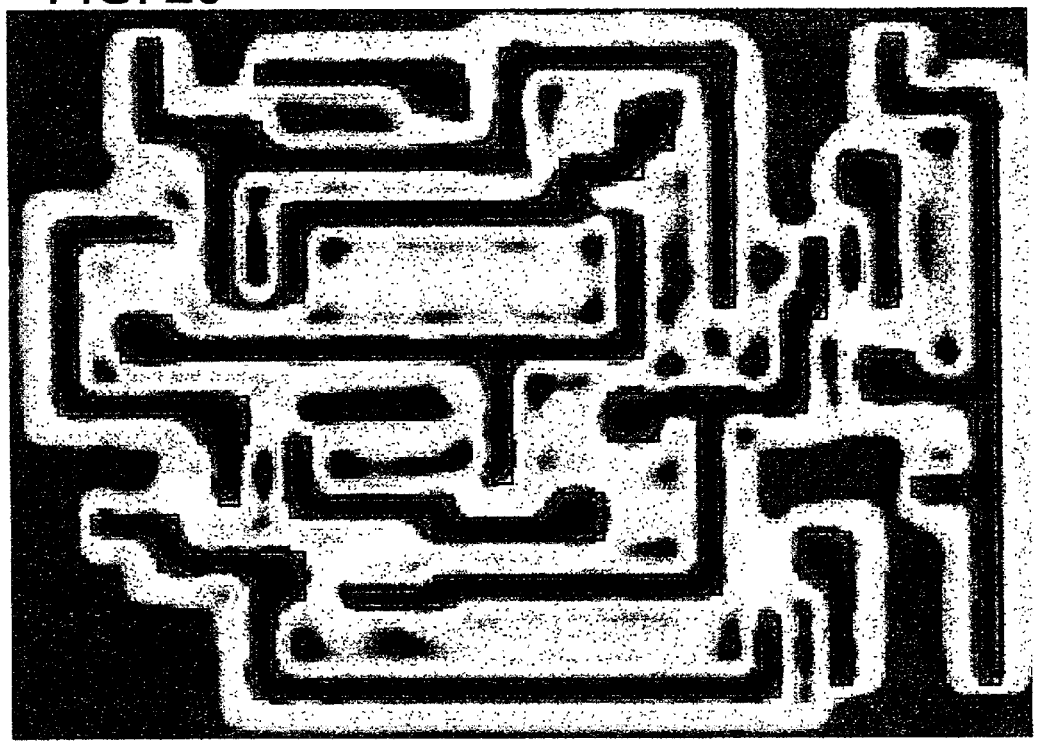

PHASE CONFLICT RESOLUTION FOR PHOTOLITHOGRAPHIC MASKS

RELATED APPLICATIONS

This application is related to, claims the benefit of priority of, and incorporates by reference, the U.S. Provisional Patent Application Ser. No. 60/296,788 filed Jun. 8, 2001 entitled "Phase Conflict Resolution for Photolithographic Masks" having inventors Christophe Pierrat and Michael Côté and assigned to the assignee of the present invention.

This application is related to, claims the benefit of priority of, and incorporates by reference, the U.S. Provisional Patent Application Ser. No. 60/304,142 filed Jul. 10, 2001 entitled "Phase Conflict Resolution for Photolithographic Masks" having inventors Christophe Pierrat and Michael Côté and assigned to the assignee of the present invention.

COLOR DRAWINGS

The file of this patent contains at least one drawing executed in color. Copies of this patent with color drawing(s) will be provided by the Patent and Trademark Office upon request and payment of the necessary fee.

BACKGROUND OF THE INVENTION

1. Field of the Invention

The present invention relates to manufacturing small dimension features of objects, such as integrated circuits, using photolithographic masks. More particularly, the present invention relates to the application of phase shift masking to complex layouts for integrated circuits and similar objects.

2. Description of Related Art

Phase shift masking has been applied to create small dimension features in integrated circuits. Typically the features have been limited to selected elements of the design, which have a small, critical dimension. See, for example, U.S. Pat. No. 5,766,806.

Although manufacturing of small dimension features in integrated circuits has resulted in improved speed and performance, it is desirable to apply phase shift masking more extensively in the manufacturing of such devices. However, the extension of phase shift masking to more complex designs results in a large increase in the complexity of the mask layout problem. For example, when laying out phase shift windows on dense designs, phase conflicts will occur. One type of phase conflict is a location in the layout at which two phase shift windows having the same phase are laid out in proximity to a feature to be exposed by the masks, such as by overlapping of the phase shift windows intended for implementation of adjacent lines in the exposure pattern. If the phase shift windows have the same phase, then they do not result in the optical interference necessary to create the desired feature. Thus, it is necessary to prevent inadvertent layout of phase shift windows in phase conflict near features to be formed in the layer defined by the mask.

In the design of a single integrated circuit, millions of features may be laid out. The burden on data processing resources for iterative operations over such large numbers of features can be huge, and in some cases makes the iterative operation impractical. The layout of phase shift windows and the assignment phase shift values to such windows, for circuits in which a significant amount of the layout is accomplished by phase shifting, is one such iterative operation which has been impractical using prior art techniques.

Because of these and other complexities, implementation of a phase shift masking technology for complex designs will require improvements in the approach to the design of phase shift masks.

SUMMARY OF THE INVENTION

The present invention provides techniques for extending the use of phase shift techniques to implementation of masks for a pattern having high density, small dimension features, and the use of such masks for implementing the pattern in a layer of an integrated circuit, or other work piece. For example, the techniques of the present invention are applied in areas including multiple features using phase shift windows, where those features are in close proximity. The techniques are also applied for so-called "full shift" of dense patterns on layers of a work piece.

One embodiment of the invention is a method for producing a computer readable definition of a photolithographic mask used for defining a layer in an integrated circuit, or other work piece, where the layer comprises a pattern including a plurality of features to be implemented with phase shifting. The method includes identifying cutting areas for phase shift regions based on characteristics of the pattern. Next, the process cuts the phase shift regions in selected ones of the cutting areas to define phase shift windows, and assigns phase values to the phase shift windows. The cutting of the regions into windows and assigning of phase shift values to the windows is basically an iterative process, in which the order of cutting and assigning depends on the particular procedure, and may occur in any order. The phase shift values assigned comprise $\phi$ and $\theta$, so that destructive interference is caused in transitions between adjacent phase shift windows having respective phase shift values of $\phi$ and $\theta$. In the preferred embodiment, $\phi$ is equal to approximately $\theta+180$ degrees. Results of the cutting of phase shift regions into phase shift windows, and assigning phase values to the phase shift windows are stored in a computer readable medium.

By identifying the cutting areas based on characteristics of the pattern to be formed, the problem of dividing phase shift regions into phase shift windows, and assigning phase shift values to the windows is dramatically simplified.

Representative criteria applied in the cutting of phase shift regions into phase shift windows, and assigning phase values to the phase shift windows, include the following:

1. Try to avoid the creation of small phase shift windows that are difficult to manufacture on the mask and that do not provide sufficient process latitude.

2. Try to keep the number of cuts to a minimum and keep the cuts with the maximum process latitude. For example, cuts originating from an outside opaque (typically chrome) corner tend to have a better process latitude than cuts originating from an inside opaque corner. Long cuts from an original opaque feature to an original opaque feature tend have more process latitude than short cuts. Cuts from an original opaque feature to a field area tend to have more process latitude than cuts from an original opaque feature to an original opaque feature.

In one embodiment of the invention, a cost function is applied, in performing the cutting and assigning steps, which relies on the identified cutting areas and on the positions and shapes of features in the pattern to be formed using the phase shift windows.

The step of identifying cutting areas includes in one embodiment of the invention, a process comprising three steps. The first step involves identifying features in the plurality of features that are characterized by non-critical process latitude to define a set of non-critical features. The second step involves identifying fields between features in the plurality of features characterized by critical process latitude to define a set of critical fields. The third step involves defining cutting areas as areas within the phase shift regions which extend between two features in the set of non-critical features, or between a feature in the set of non-critical features and a field outside the phase shift regions, without intersecting a field in the set of critical fields. The identified cutting areas are further refined in other embodiments, by changing the shape of the cutting areas or by elimination of cutting areas, based upon characteristics of the pattern, characteristics of phase shift windows which may result from cutting in the cutting area, and/or other criteria that identify areas in which cutting is less desirable.

Examples of non-critical features include elbow shaped features, T-shaped features, and polygons larger than a particular size. Parameters utilized to identify non-critical features can be determined using simulations based upon simulation criteria which tends to flag features characterized by non-critical process latitude. For example, simulations of over exposure conditions tend to identify non-critical features.

Examples of critical fields include fields between narrow lines that are close together. Parameters utilized to identify critical fields can be determined using simulations based upon simulation criteria which tend to flag fields characterized by critical process latitude. For example, simulations of under-exposure conditions tend to identify critical fields between features which bridge together across the critical field in under-exposure conditions.

In one embodiment, the phase shift windows are laid out in an opaque background. In another embodiment, the phase shift windows are laid out in a clear background.

In another embodiment of the invention, an article of manufacture comprising a machine readable data storage medium having stored thereon instructions executable by a data processing system defining steps for laying out a photolithographic mask according to the process is described above. In another embodiment of the invention, a data processing system including a processor and memory storing such instructions is provided.

In another embodiment, the present invention provides a photolithographic mask including a plurality of phase shift regions divided into phase shift windows in cutting areas that are defined as described above. Thus, a photolithographic mask for defining a pattern in a layer to be formed using the mask, wherein said pattern includes a plurality of features, and said layer includes fields outside said pattern, is provided that comprises a substrate, a mask layer of material on said substrate. The mask layer includes phase shift regions and fields, and a plurality of phase shift windows in the phase shift regions, the plurality of phase shift windows characterized by phase shift values that create phase transitions between the phase shift windows to form said pattern, wherein the boundaries of the phase shift windows lie within cutting areas that are defined based upon characteristics of said pattern. A set of features in the plurality of features, where features in the set are characterized by non-critical process latitude, and a set of critical fields between features in the plurality of features where fields in the set are characterized by critical process latitude. The cutting areas include areas within the phase shift regions which extend between two features in the set of features, or between a feature in the set of features and a field outside the phase shift regions, without intersecting a field in the set of critical fields.

In further embodiments, the present invention provides a method for manufacturing photolithographic masks according to the process described above, and a method for manufacturing a layer in an integrated circuit utilizing the photolithographic mask as described above. In addition, a new class of integrated circuits is provided that is manufactured according to the methods described herein, and have a patterned layer of material with a plurality of small dimension features which are closely spaced and implemented using alternate phase shift masking. The new class of integrated circuits comprise layers have a dense pattern of small features, that was not achievable applying the prior art techniques.

Accordingly, the present invention provides for the design and layout of photolithographic masks, and the manufacture of integrated circuits, in which the use of phase shifting is extended to so-called "full shift" patterns, in which a pattern in the integrated circuit layer is defined utilizing alternate phase shifting techniques. According to the processes provided, a new class of integrated circuits becomes practical with layers having patterns comprising high-density layout of small dimension features to a degree not possible in prior art.

Other embodiments, aspects and advantages of the presentation, can be seen upon review of the figures, the detailed description and the claims which follow.

BRIEF DESCRIPTION OF THE FIGURES

The file of this patent contains at least one drawing executed in color. Copies of this patent with color drawing(s) will be provided by the Patent and Trademark Office upon request and payment of the necessary fee.

FIG. 5 is a color printout of a simulation done under over-exposure conditions which tend to identify non-critical features in the pattern.

FIG. 6 shows the pattern of FIG. 5 in which non-critical features in the pattern are marked.

FIG. 9 illustrates the layout of phase shift regions for the pattern of FIG. 5.

FIG. 10 illustrates the pattern of FIG. 9 with non-critical features and critical field areas identified.

FIG. 11 illustrates cutting areas identified for critical features in the pattern of FIG. 9.

FIG. 12 illustrates cutting areas as modified for non-critical features in the pattern of FIG. 9.

FIG. 13 illustrates cutting areas as modified to account for T-shaped features in the pattern of FIG. 9.

FIG. 14 illustrates cutting areas as modified for outside corners and small spaces in the pattern of FIG. 9.

FIG. 16 illustrates a representative layout of phase shift windows for the pattern of FIG. 9.

FIG. 17 illustrates a representative layout of a trim mask for use with the phase shift mask of FIG. 16.

FIG. 19 illustrates a representative layout of phase shift windows of FIG. 16, with optical proximity correction.

FIG. 20 illustrates a simulation of an exposure pattern using a mask as shown in FIG. 19.

DETAILED DESCRIPTION

Figure 1:
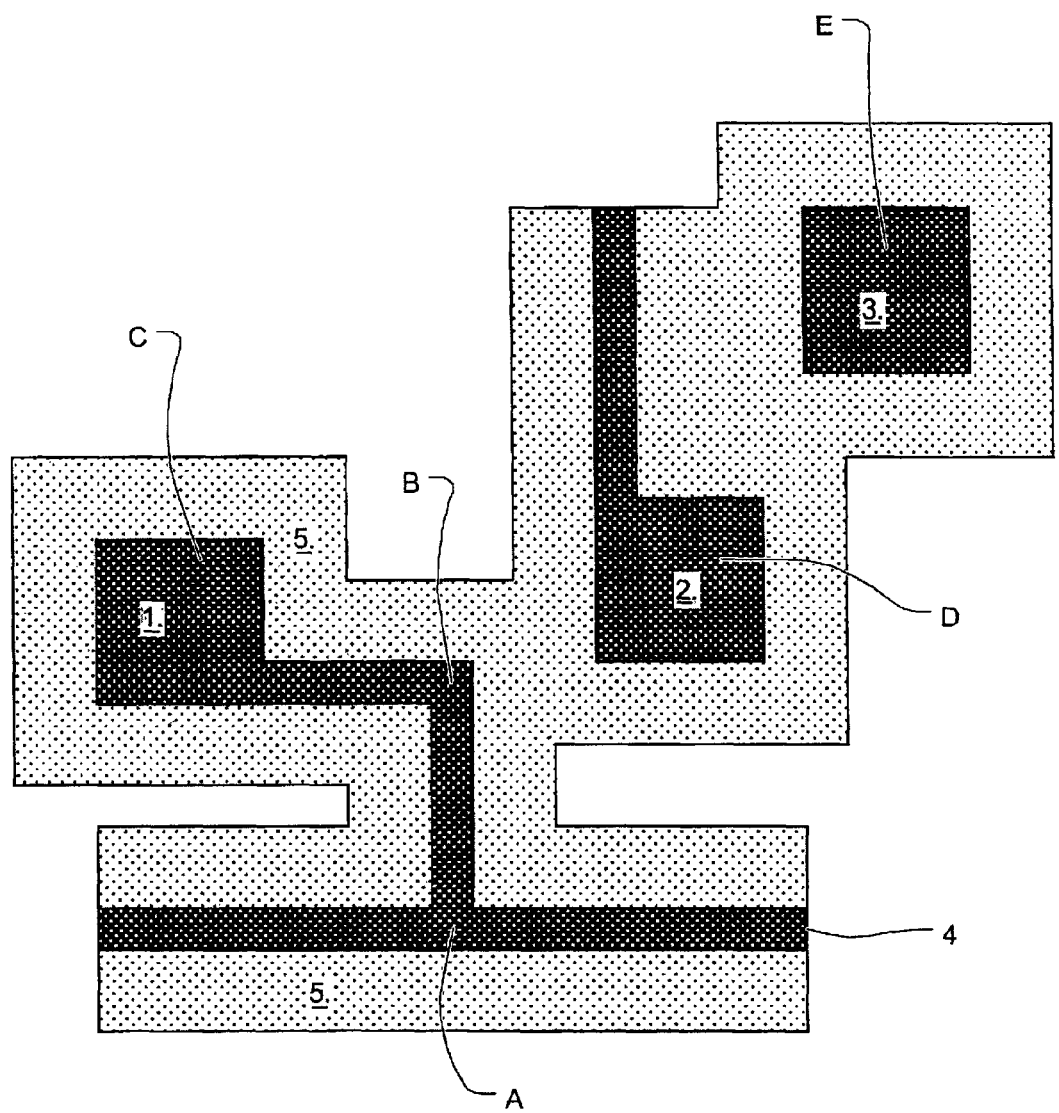
FIG. 1 illustrates a complex pattern of features, and phase shift regions for defining the features using a "full shift" technique according to the present invention, prior to cutting the phase shift regions into phase shift windows and assigning phase shift values to the phase shift windows.

A detailed description of embodiments of the present invention is provided with respect to the figures. The basic invention can be understood with reference to FIGS. 1 and 2. In FIG. 1, a pattern that includes a plurality of features in the three opaque regions 1, 2 and 3 is shown. For a "full shift" implementation of a mask for creating the pattern, phase shift regions 5 are laid out by forming boundaries of the phase shift regions parallel with the sides of the dark regions 1, 2, 3 with the exception of the ends of narrow lines., such as the line end 4. The problem solved by the present invention is to create phase shift windows in the phase shift regions for an alternating phase shift mask to implement the three dark regions 1, 2, 3. Thus, one must decide where to cut the phase shift regions 5 to form the phase shift windows, without creating phase conflicts, with as few cuts as practical.

According to the present invention, non-critical features in the pattern are identified first. Such features in this example include T-shaped features such as the feature A, elbow shaped features such as the feature B, and large polygons such as the features C, D, and E. Also, field areas outside the phase shift regions are identified. Potential cutting areas are determined based on these characteristics of the pattern, so that the phase shift region should be cut along lines between non-critical features, or along lines between a non-critical feature, and a field area that is outside the phase shift region. Furthermore, the phase shift regions should not be cut along lines which intersect narrow fields, having lesser process latitude, as explained in more detail below.

Figure 2:
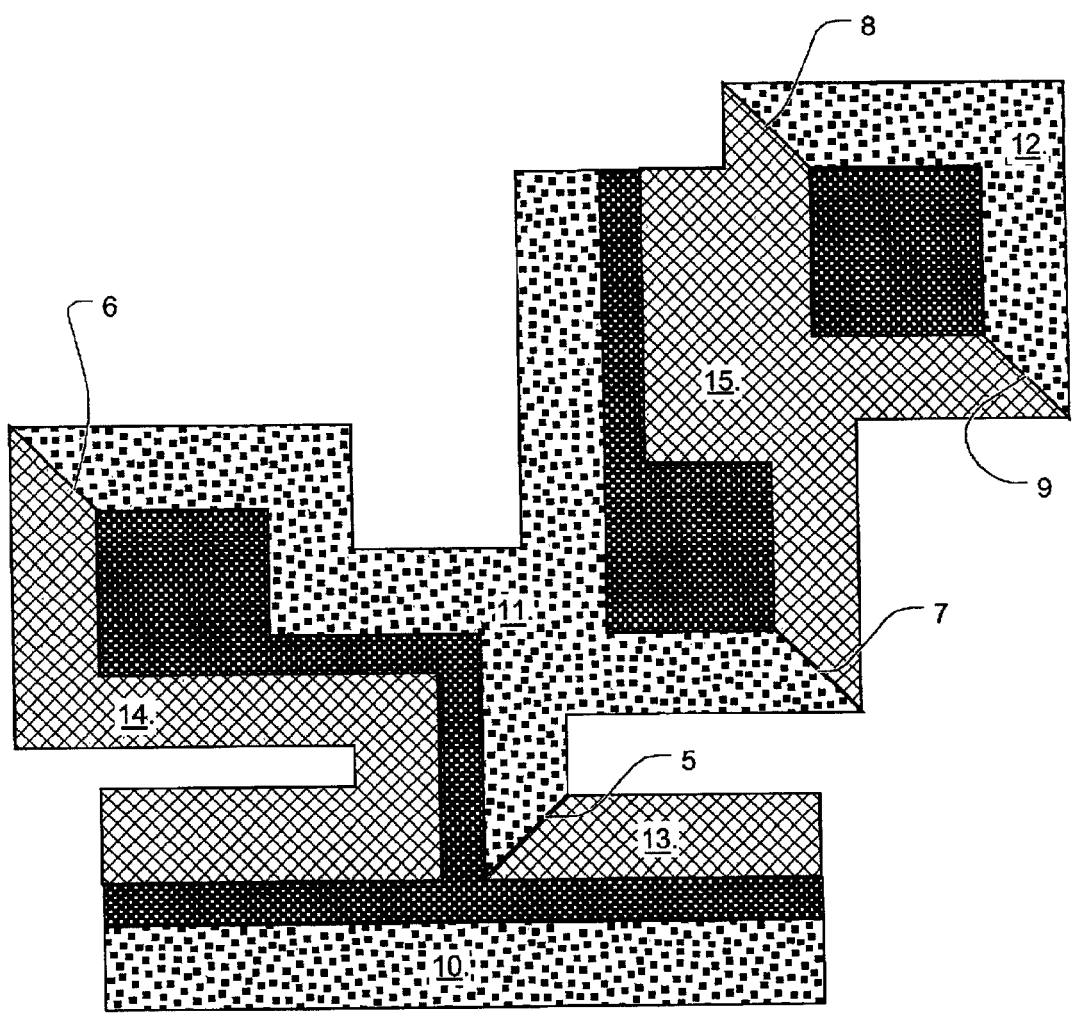
FIG. 2 illustrates the pattern of FIG. 1, after cutting the phase shift regions into phase shift windows and assigning phase shift values to the phase shift windows.

FIG. 2 shows one example layout of the phase shift windows for the pattern of FIG. 1, where the phase shift region is cut along a line 5 from the non-critical feature A to the field, along a line 6 from the non-critical feature C to the field, along a line 7 from the non-critical feature D to the field, along a line 8 from the non-critical feature E to the field, and along a line 9 from the non-critical feature E to the field. As a result, phase shift windows 10, 11, 12 are created and assigned a phase value of 2, and phase shift windows 13, 14 and 15 are created and assigned a phase shift value of N, where N is equal to approximately 2+180 degrees, so that desired destructive interference occurs for definition of the desired pattern. In the context of an alternating phase shift mask, it is preferred that N be close to 180 degrees plus 2, such as within plus or minus 10 degrees. Other phase shifting techniques may apply other combinations of phase values, or require stepped phase values so that more than two phase values are used.

The problem of selecting the locations of the cuts to create the phase shift windows is extremely complex, because the large numbers options for locating the cuts. The identification of a bound number of cutting areas based on features of the pattern, as taught by the present invention significantly simplifies this problem.

Figure 3:
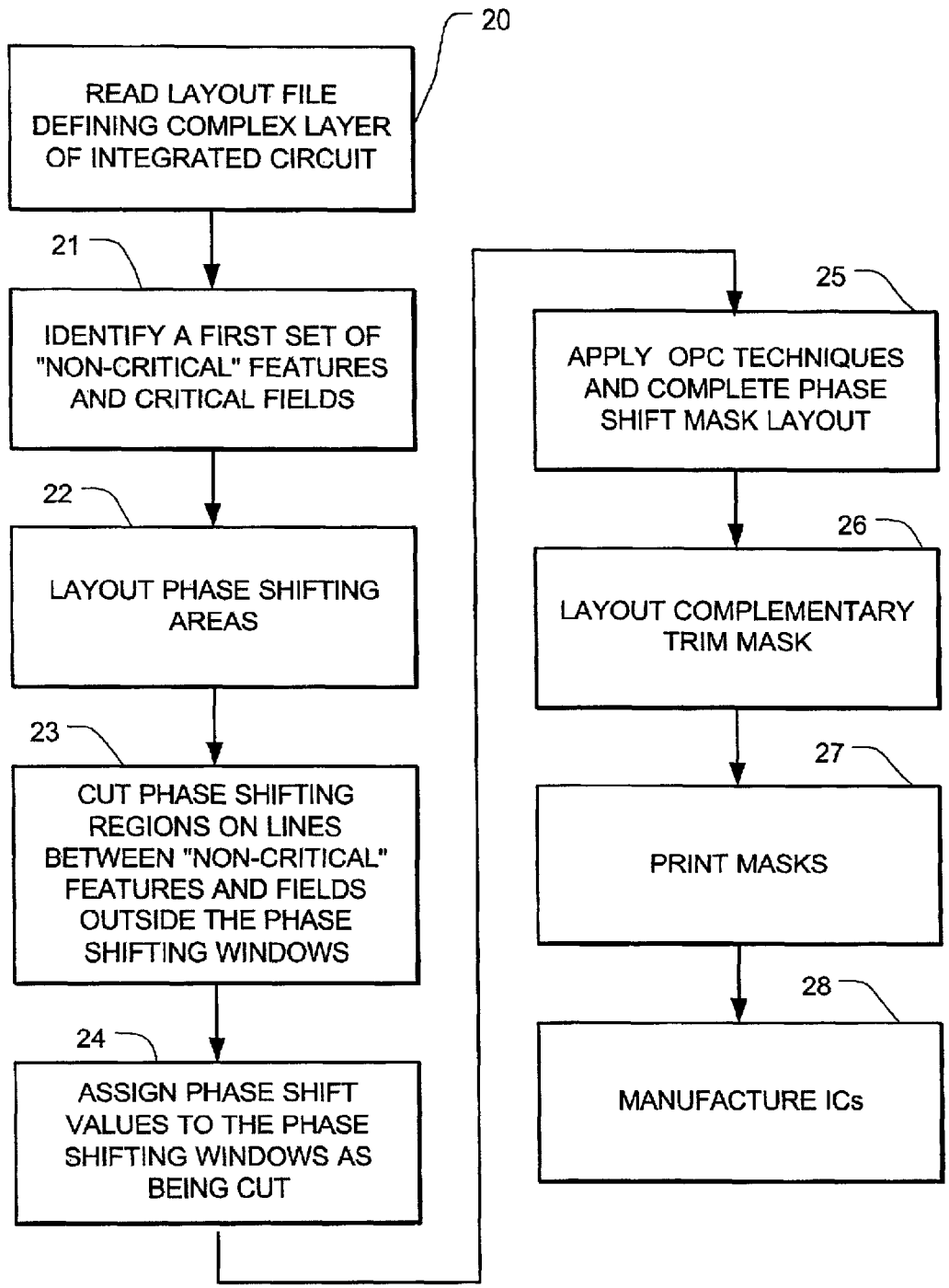
FIG. 3 is a simplified flow chart illustrating a process for defining a phase shift mask, manufacturing the mask and manufacturing integrated circuits according to present invention.
Figure 4:
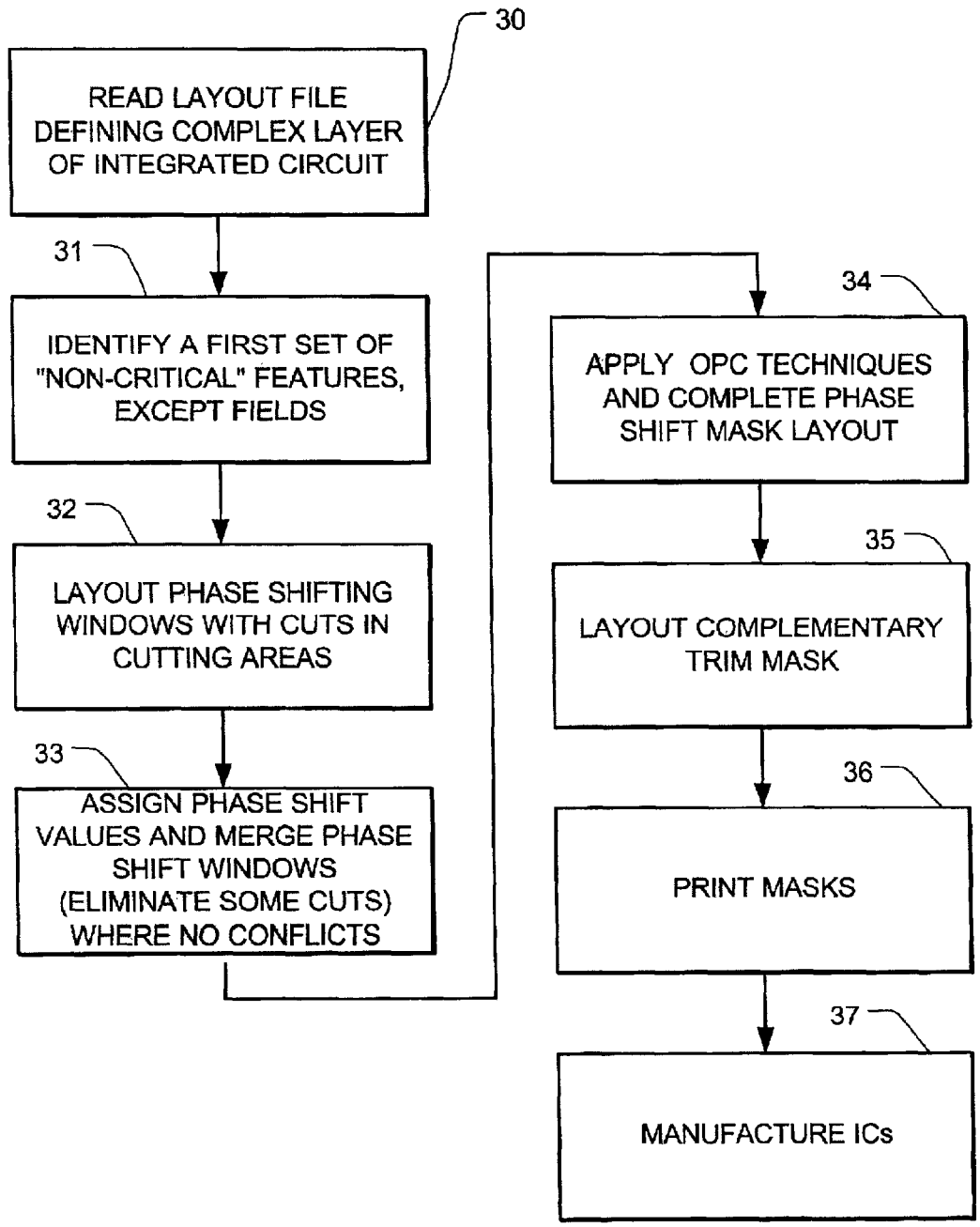
FIG. 4 is a simplified flow chart illustrating an alterative process for defining a phase shift mask, manufacturing the mask and manufacturing integrated circuits according to present invention.

FIGS. 3 and 4 illustrate alternative approaches to the phase shift window cutting and phase value assignment solution of the present invention. As shown in FIG. 3, the process begins by reading a layout file defining a complex layer of an integrated circuit, or other work piece (block 20). A software algorithm is applied to identify "non-critical" opaque features, which are characterized by greater process latitude (block 21). Also in the step represented by block 21, "critical" fields are identified which are characterized by lesser process latitude. Next, phase shift regions are laid out around the pattern, which are to be cut into phase shift windows (block 22). Cutting areas are identified based upon the features of the pattern, and the phase shift regions are cut on lines between "non-critical" features, or between a non-critical feature and a field, including fields near line ends, without intersecting so-called "critical" field regions (blocks 23 and 24). After the phase shift windows are defined, optical proximity correction techniques are applied to complete a phase shift mask layout (block 25). A complementary trim mask is defined as known in the art, which for an opaque background phase shift mask, trims line ends and unwanted artifacts created by the transitions between phase shift windows that are not part of the pattern to be formed on the layer, and optionally defines other features in the layer (block 26). The phase shift masks are printed (block 27), and integrated circuits are manufactured using the masks to complete the manufacturing process (block 28).

FIG. 4 illustrates an alternate flow for the process. The flow of FIG. 4 likewise begins by reading a layout file defining a complex layer of an integrated circuit, or other work piece (block 30). A software algorithm is applied to identify "non-critical" features, which are characterized by greater process latitude (block 31). Also in the step represented by block 31, "critical" fields identified which are characterized by lesser process latitude. Next, preliminary phase shift windows are laid out adjacent features that have lesser process latitude than the "non-critical" features, with cuts in cutting areas (block 32). Next, phase shift values are assigned, and the preliminary phase shift windows are merged to form final phase shift windows, by eliminating some cuts (block 33). Thus, rather than beginning with a unified phase shift region as shown in FIG. 1, a plurality of small preliminary phase shift windows is used for the starting position for this process flow. Using either flow, cutting areas are defined and final cuts are selected in cooperation with the process of assigning phase shift values to the resulting phase shift windows. After the phase shift windows are defined, optical proximity correction techniques are applied to complete a phase shift mask layout (block 34). A complementary trim mask is defined as known in the art (block 35). The phase shift masks are printed (block 36), and integrated circuits are manufactured using the masks to complete the manufacturing process (block 37).

The "non-critical" features of the pattern can be understood with reference to FIG. 5, which is a printout of a simulation formed using over exposure conditions. The features of the pattern which remain unexposed according to the simulation are identified by contour lines (e.g. line 40) around darker regions in the printout. These unexposed features correlate with the "non-critical" opaque features which are used for the purposes of the present invention to identify cutting areas for the phase shift windows in the layout problem. For example, non-critical areas can be areas that are left over after an over exposure of about 20 percent from a nominal dose and de-focus at the edge of the focus latitude window for example of about 0.3 micron. The simulation process can also be used to determine parameters that can be used with a design rule checker of layout tool to identify the "non-critical" features using a software algorithm analyzing the machine readable layout. The parameters used by such tools can also be determined by trial and error, or by simply applying knowledge of persons skilled in the art.

It can be seen that non-critical features comprise large polygons, any elbow or "T," and fields that are opaque in an opaque background phase shift layout, since such opaque fields will be removed during the exposure with the trim mask. Preferential cuts are made between the non-critical areas and fields near line ends, since line ends are already cut using the second level exposure, and according to other "cost function" criteria as described below.

FIG. 6 shows the layout of the pattern simulated in FIG. 5, with the non-critical features identified by diagonal hatching. The contour line 40 of FIG. 5, corresponds to the feature 41 of FIG. 6.

Figure 7:
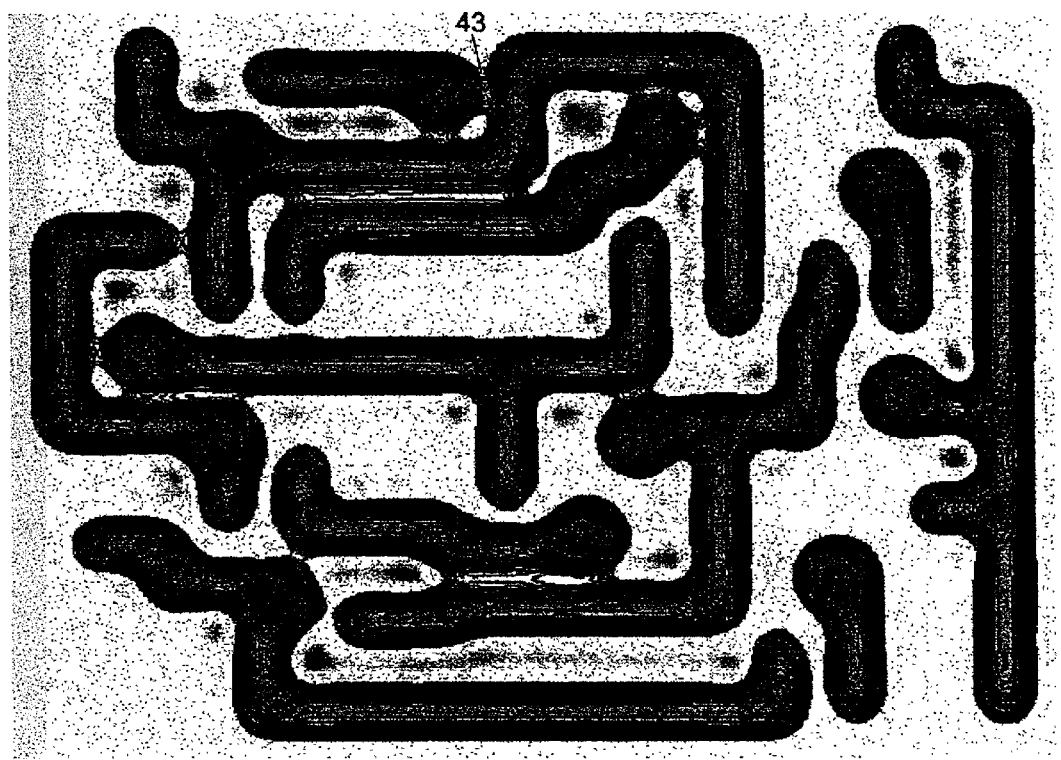
FIG. 7 is a color printout of a simulation done with under-exposure conditions which tend to identify critical field areas between features in the pattern of FIG. 5.

The definition of a critical field area can be understood with reference to FIG. 7, which shows a printout of a simulation of extreme under exposure conditions. Certain tight space areas (e.g. area 43) tend to bridge due to the under exposure between features in the pattern. Such tight space areas can be seen where the patterns are bridging in FIG. 7. For example, critical field areas can be areas bridging after an under exposure by 20 percent from a nominal dose, and the focus at the edge of the focus latitude of for example 0.3 micron. The critical field areas can also be flagged using a set of rules used in a design rule checker or layout tool for example, with the parameters determined by the simulation process, by trial and error, or by applying knowledge of persons skilled in the art. The phase shift regions should not be cut to form phase shift windows through critical field areas.

Figure 8:
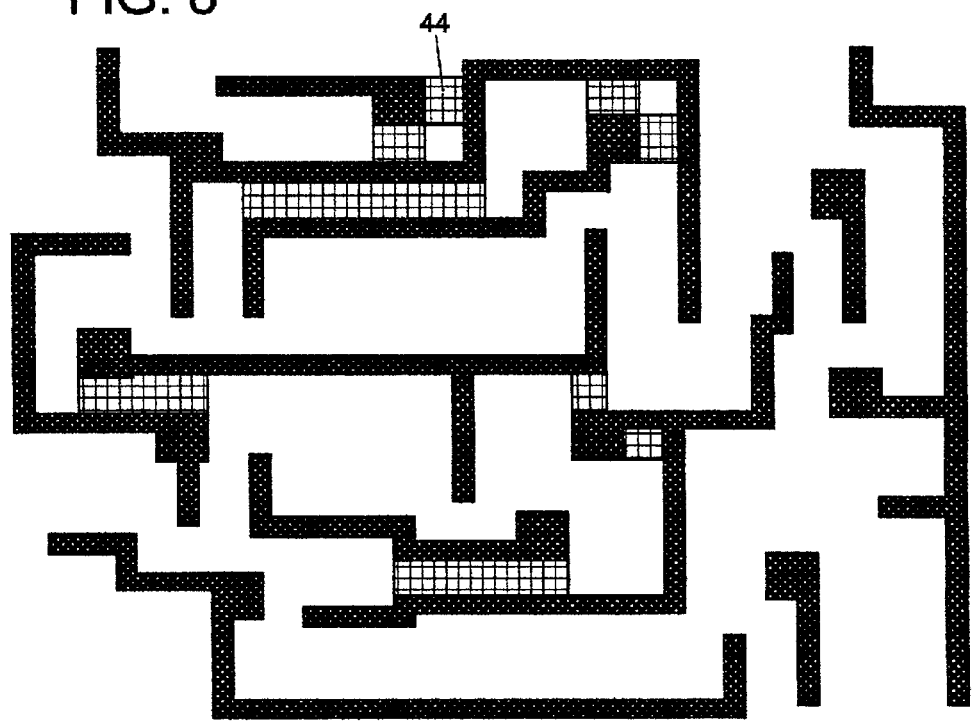
FIG. 8 shows the pattern of FIG. 5 in which critical field areas are marked.

FIG. 8 illustrates the pattern simulated in FIG. 7, with the critical space areas identified in by cross-hatching. The area 43 of FIG. 7 corresponds to the area 44 in FIG. 8.

The process of identifying cutting areas for the pattern shown FIGS. 5–8 can be understood with reference to FIGS. 9–15. In FIG. 9, phase shift regions 45 are defined surrounding the pattern shown in black, by extending lines parallel to the sides of the opaque features in the pattern and spaced away by a selected amount. Characteristics of the pattern that are to be applied in the defining of cutting areas can be seen in FIG. 10, in which the phase shift regions, the critical field areas shown in diagonal hatching, and the non-critical features of the pattern shown in cross-hatching are combined.

FIG. 11 shows a first step in the process of identifying cutting areas according to one process flow. In this step, portions of phase shift regions (e.g. portion 46) shown in square dot hatching which are to be protected from cutting in order to define the critical dimension features of the pattern are shown.

In FIG. 12, portions of the phase shift regions to be protected are extended by allowing phase shift windows adjacent to the non-critical features as well as the critical features. Thus, it can be seen that adjacent the large rectangle 50, a phase shift region 51 is protected from cutting. Other similar portions of the phase shift regions are protected from cutting as can be seen by a comparison of FIGS. 11 and 12.

In FIG. 13, the shapes of the cutting areas shown in square dot hatching are adjusted to account for T-shaped features. Thus, near the T-shaped feature 52, the shape of the cutting area 53 has been adjusted. Similar adjustments to the shapes of cutting areas have been made near other T-shaped features.

In FIG. 14, further adjustments to the shapes of the cutting areas are made to clean up outside corner features, such as the outside corner features 54, where the cutting region is reduced in area as shown at region 55, in order to fill in the potential sides of the patient window. Also, small spaces in the field of the phase shifter layer are cleaned out. Thus, the small opaque field area 56 of FIG. 13 is eliminated in the layout of FIG. 14, by extension of the phase shift region to cover it.

Figure 15:
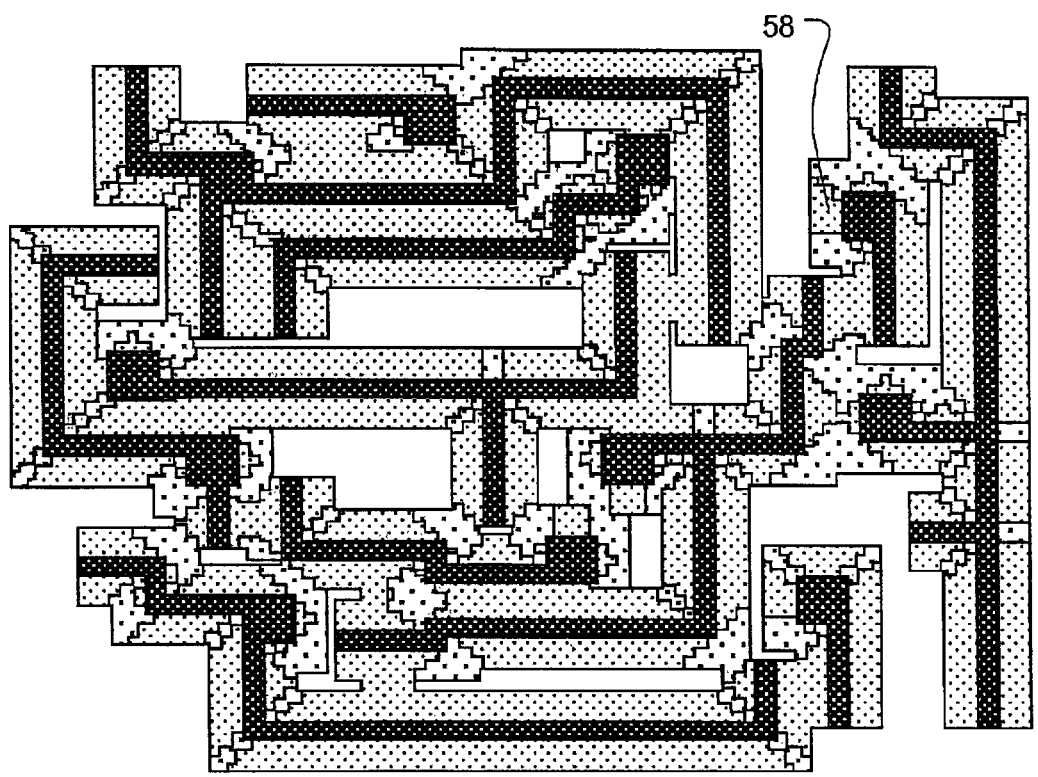
FIG. 15 illustrates the cutting areas as modified for small shifters in the pattern of FIG. 9.

In FIG. 15, the final layout of the cutting areas is shown, including isolated small shifter extensions. Thus, the small area 57 of FIG. 14 which is protected from cutting, is increased in size to establish region 58 as shown in FIG. 15. Similar adjustments are made to other small shifter regions. Adjustments are made only if the phase shift window is sufficiently isolated from other phase shift windows, so that merger of windows is avoided while the number of possible cuts is reduced.

Given a bounded number of identified cutting areas shown in yellow within the adjusted phase shift region in the layout of FIG. 15, a process of selecting cuts and assigning phase values to form phase shift windows is initiated according to present invention. One example layout is shown in FIG. 16, where zero degree phase shift regions (e.g. region 48) are identified by irregular square dot hatching, 180 degree phase shift regions (e.g. region 49) are identified by diagonal cross-hatching, and the pattern is identified by generally black filler. Opaque background areas are left white in this diagram.

FIG. 17 is a diagram of a binary trim mask for use with the phase shift mask of FIG. 16. The trim mask can be produced by initially OR'ing the phase layers and the poly layer with one another. Then, sizing down by minus 0.02 μm (for 248 nm process) and then OR'ing that sized down layer with the original field poly. The resulting trim mask is smaller than phase regions, but sufficiently sized to protect against misalignment. Other embodiments of trim masks are made using attenuated binary masking, or other types of masks.

Figure 18:
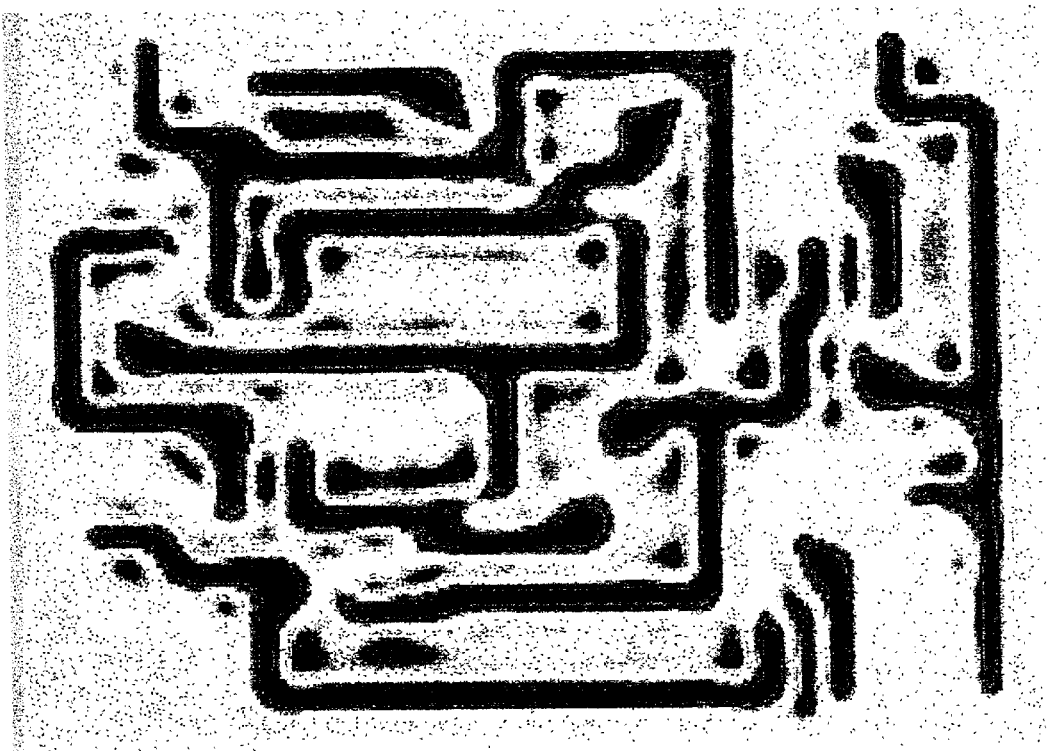
FIG. 18 illustrates a simulation of an exposure pattern using a masks as shown in FIG. 16 and FIG. 17, without optical proximity correction.

FIG. 18 is a print out of a simulation of the exposure created using the mask layouts shown in FIGS. 16 and 17. As can be seen, the desired pattern is substantially formed.

FIG. 19 shows a modification of the phase shift windows of FIG. 16 after application of optical proximity correction techniques known in the art. Thus, the modified zero degree phase shift windows are identified with irregular square dot hatching, and the modified 180 degree phase shift windows are identified with diagonal cross-hatching. The simulation of the pattern exposed using the mask of FIG. 19 is shown in FIG. 20. FIG. 20 also shows a trace of the original pattern defined in the layout file. As can be seen, the exposure matches the original layout quite well.

The resulting layer in an integrated circuit according to the present invention is characterized by a dense pattern of small features formed using alternate phase shift masking. For a given wavelength of exposing radiation, the density is improved significantly by applying these techniques.

Representative prototypes of computer programs implemented using a design rule checker DRC, such as Cadence DRC tools (Assura or Vampire) available from Cadence Design Systems, San Jose, Calif., or a layout tool such as the Cadabra tool (abraCAD) available from Cadabra, a Numerical Technologies, Inc. company, San Jose, Calif., which perform the process of defining the shapes and positions of phase shift window according to the present invention operate as explained below.

The basic process flow for either prototype includes the following:

1. Create the phase layer with no cut. The shifter layer that defines phase shift regions is created by sizing the original layout by a given width (shifter width). Only the line-ends are not sized.

2. Identify the non-critical regions of the layout. For both tools, a similar methodology is used. For example using Assura, we define:

```
L1 = original poly layer definition, including the pattern to be processed.
L2 = non-critical regions of the original poly layer.
L2_1 = geomSize(L1 −0.06 edges)    ;; create a layer L2_1 from the original edge location to
                                   ;; an edge location moved by 0.06 micron inside the polygons,
                                   ;; so that widths smaller than 0.12 micron disappear.
L2_2 = geomAndNot(L1 L2_1)         ;; subtract L2_1 from L1.
L2 = geomSize(L2_2 0.06)           ;; size L2_2 by 0.06 micron, this layer contains all the large
                                   ;; features from L1 as well as the "Ts" and elbows.
```

3. Identify critical space regions.

```
L1 = original poly layer definition.
L3 = critical space region of the original poly layer.
L3_1 = geomSize(L1 0.1 edges)   ;; creates a layer L3_1 from the original edge location to
                                ;; an edge location moved by 0.1 micron outside the
                                ;; polygons (all spaces below 0.2 micron will be merged).
L3_2 = geomSize(L3_1 −0.05)     ;; sizes down L3_1 by 0.05 micron, only bridged areas remain.
L3 = geomSize(L3_2 0.05)        ;; brings bridged areas back to normal size.
```

4. Create phase-shifting regions protected from cutting, as shown in FIGS. 11–15.

5. Create possible cut regions: the difference between the phase-layer with no cut (step1—See FIG. 9) and the phase-shifting regions (step 4—See FIG. 15) represents the areas where the cuts are allowed.

6. Assign phase values (for example 0 or 180 degrees) and decide which cut should be used: the decision on phase value assignment and on choice of cut is made using the following criteria:

a) try to avoid the creation of small phase-shift windows that are difficult to manufacture on the mask and that do not provide sufficient process latitude.

b) try to keep the number of cuts to a minimum and keep the cuts with the maximum process latitude. For example, cuts originating from an outside opaque (chrome) corner tend to have a better process latitude than cuts originating from an inside opaque corner. Long cuts from an original opaque feature to an original opaque feature tend have more process latitude than short cuts. Cuts from an original opaque feature to a field area tend to have more process latitude than cuts from an original opaque feature to an original opaque feature.

c) The selection rules are used to create a cost function, according to known techniques that is minimized during the process of assigning phases and choosing cuts.

Figure 21:
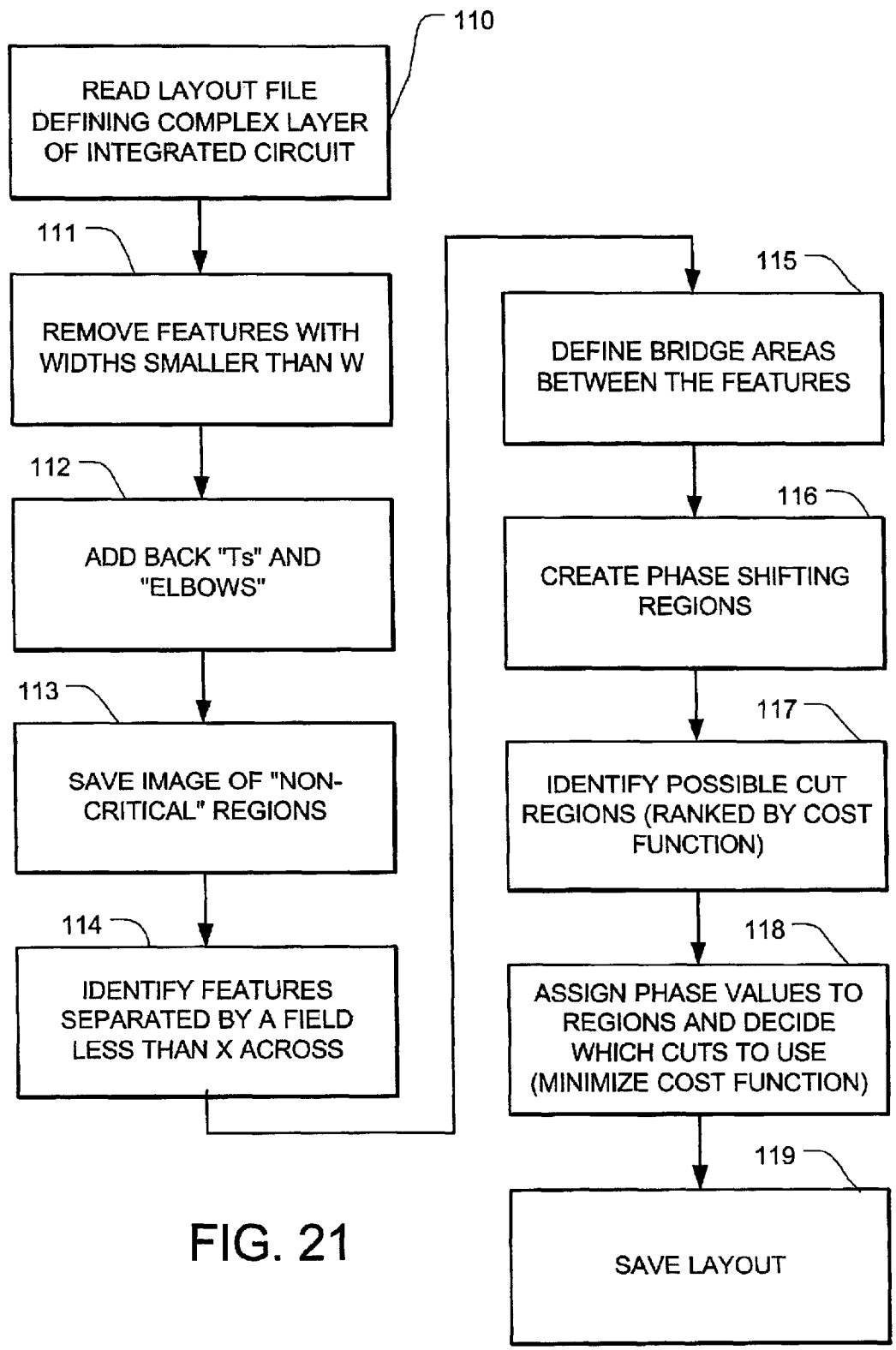
FIG. 21 is a simplified flow chart of a process for identifying cutting areas, cutting the shift regions into phase shift windows in the cutting areas, and assigning phase shift values to the phase shift windows.

FIG. 21 is a simplified flow diagram for the process of laying out phase shift windows according to one embodiment of the present invention. The process begins with reading out a layout file defining a complex layer including a pattern to be implemented (block 110). Features of the pattern having a width smaller than a parameter W are removed (block 111). T-shaped and elbow-shaped features are added back (Block 112). The resulting image is saved as an image of "non-critical" features (block 113). Next, features are identified that are separated by a field less than a parameter X across (block 114). "Critical" bridge areas are defined as the fields between such features (block 115). Phase shift regions are created around the pattern, from which phase shift windows will be created (block 116). Possible cut regions are identified based upon the features of the pattern outlined above, and ranked by cost function (block 117). Phase values are assigned to regions and decisions are made as to which cuts to use while minimizing the cost function, to create the final layout of phase shift windows (block 118). The layout is saved in a computer readable medium (block 119).

Figure 22:
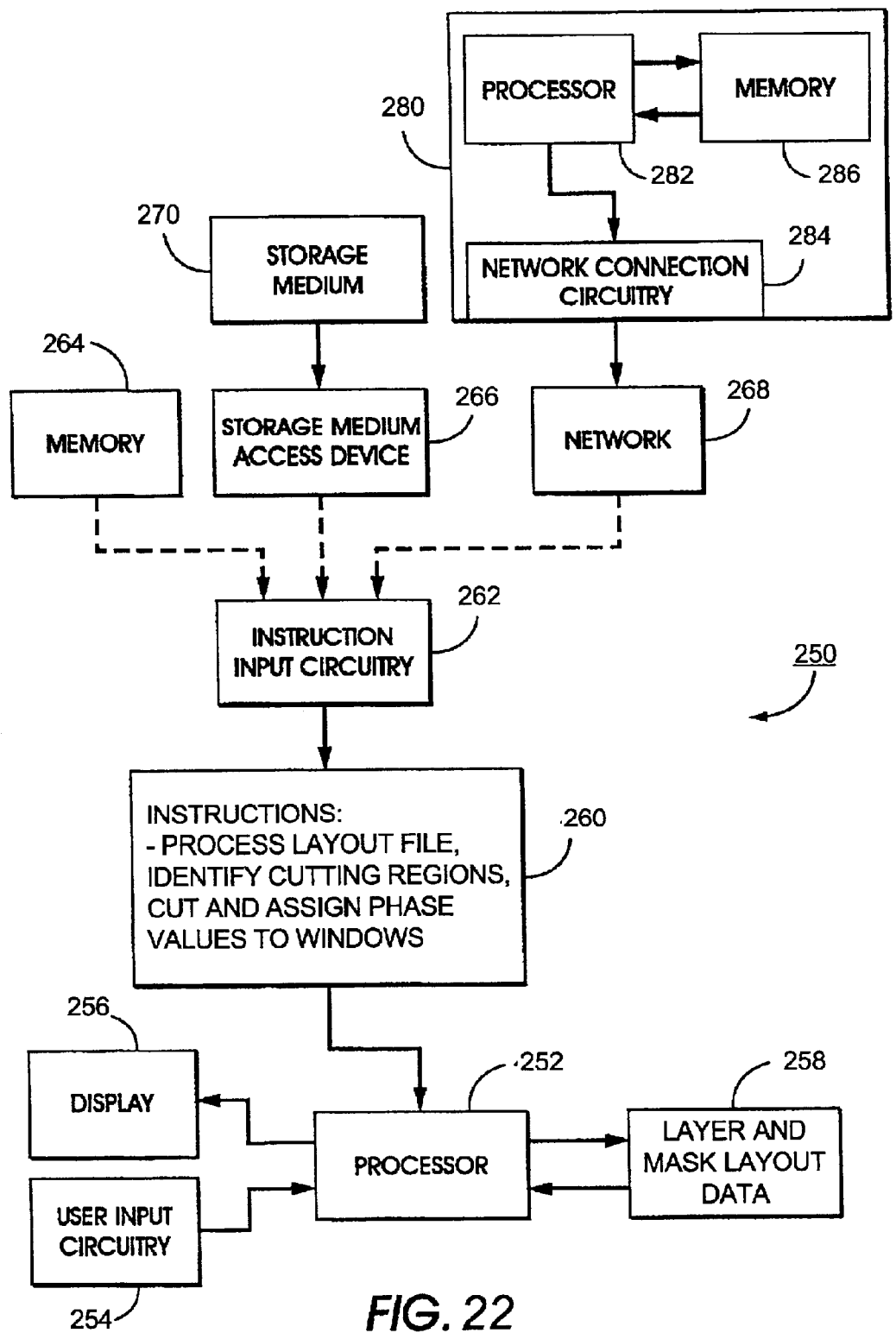
FIG. 22 is a simplified diagram of data processing system according to one example of the present invention.

The generation of phase shift masks for a complex structure is a non-trivial processing problem. FIG. 22 illustrates a data processing system for such task, representative of a wide variety of computer systems and computer architectures suitable for this application. Machine 250 in FIG. 22 includes processor 252 connected for receiving data indicating user signals from user input circuitry 254 and for providing data defining images to display 256. Processor 252 is also connected for accessing mask and layer layout data 258, which define a mask layout under construction and a layout for a layer of material to be exposed using the mask. Processor 252 is also connected for receiving instruction data 260 indicating instructions through instruction input circuitry 262, which can illustratively provide instructions received from connections to memory 264, storage medium access device 266, or network 268.

In executing the commands indicated by instruction data 260, processor 252 uses layout data 258 to provide data defining a layout for a mask, and optionally an image of the mask layout to display 256 to cause it to present a representation of the layout.

In executing the instructions indicated by instruction data 260, processor 252 also receives user signal data from user input device 254, as necessary for control of, or interaction with, the process.

As noted above, FIG. 22 illustrates three possible sources from which instruction input circuitry 262 could receive data indicating instructions: memory 264, storage medium access device 266, and network 268.

Memory 264 could be any conventional memory within machine 250, including random access memory (RAM) or read-only memory (ROM), or could be a peripheral or remote memory device of any kind.

Storage medium access device 266 could be a drive or other appropriate device or circuitry for accessing storage medium 270, which could, for example, be a magnetic medium such as a set of one or more tapes, diskettes, or floppy disks; an optical medium such as a set of one or more CD-ROMs; or any other appropriate medium for storing data. Storage medium 270 could be a part of machine 250, a part of a server or other peripheral or remote memory device, or a software product. In each of these cases, storage medium 270 is an article of manufacture that can be used in machine 250. Data units can be positioned on storage medium 270 so that storage medium access device 266 can access the data units and provide them in a sequence to processor 252 through instruction input circuitry 262. When provided in the sequence, the data units form instruction data 260, indicating instructions as illustrated.

Network 268 can provide instruction data 260 received as a communication from machine 280. Processor 282 in machine 280 can establish a connection with processor 252 over network 268 through network connection circuitry 284 and instruction input circuitry 262. Either processor could initiate the connection, and the connection could be established by any appropriate protocol. Then processor 282 can access instruction data stored in memory 286 and transfer the instruction data over network 268 to processor 252 so that processor 252 can receive instruction data 260 from network 268. Instruction data 260 can then be stored in memory 264 or elsewhere by processor 252, and can be executed.

The resulting layout data is stored in a machine readable form, or presented in a communication to a remote system.

Automatic assignment of phase shift regions, and addition of optical proximity correction features, as described above are provided in this example to facilitate processing. Three stages in the generation of phase shift mask layouts according to the process which is implemented using a design rule checking programming language (e.g. Assura (TM) Design Rule Checker provided by Cadence Design Systems) in a data processing system, like that of FIG. 22, for one example, include definition of input layers, generation of output layers, and cutting and assignment of phase values to the phase shift windows.

In some embodiments, the display 256 supports depiction (and in some embodiments interaction with) one or more of the representations of the data shown generally in figures. For example, the representation of FIG. 6 where non-critical features of the pattern are marked in a distinguishing color could be presented for review and/or human modification. Similarly, the results of simulated exposures with and/or without OPC could be reviewed and possibly compared with a non-phase shifting exposure.

In some embodiments, the assignment of phase values to regions is simplified (see blocks 117–118 of FIG. 21). Specifically, for many real world designs, the assignment can be done without the ranking (see block 117 of FIG. 21) and without the minimization of a cost function (block 118). One heuristic is to assume that a cut will be made in all possible cut regions and to assign phase values accordingly.

More generally, minimization of the cost function may be computationally intractable, or simply computationally undesirable, for one or more designs. Specific implementations may chose from a number of data representations and approaches (e.g. start with no cuts vs. start with all cuts). One embodiment uses a graph representation where each phase shifter region is represented as a node and one set of edges is used to represent adjacency and another set of edges is used to represent phase restrictions, e.g. an edge indicates that the two shifter regions must be of different phase, e.g. across a feature. Feasibility can be checked in such a graph by identifying odd length cycles of phase restrictions. To find a better solution than the heuristic above, adjacent nodes can be merged (e.g. a cut removed) provided that a phase conflict is not created. If the adjacency edges (representing cutting regions) are weighted to indicate the relative cost of the cut then one approach is to attempt to merge adjacent nodes connected by the smallest (or greatest) edge weights. However, as FIG. 16 shows, some solutions may include extending or merging phase shift regions into the (opaque) field to form larger shifter regions.

The particular data representation and approach to solving the produced coloring problem may be varied to meet the computational needs and/or combined with multiple approaches. For example, the graph approach described above could be applied for a predetermined number of iterations and then, optionally, be followed by further human optimization.

Embodiments of the invention generally require two masks, the phase shifting mask and the trim mask. Because the cost of manufacturing two masks will exceed the cost of manufacturing a single mask, designers of ICs may want to carefully select which layers will be produced according to embodiments of the invention. For example, the designer might use embodiments of the invention to produce some layers while producing other layers with single-mask techniques. In one embodiment, only those layers of the IC that include patterns with a large number of densely packed, small dimension features relative to the density and size of features on other layers of a particular design are produced using the PSM approaches described herein. In other embodiments, factors considered in making the selection take into account IC yield and performance if a given layer is produced using the PSM approaches described herein.

While the present invention is disclosed by reference to the embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for producing a computer readable definition of a photolithographic mask that defines a pattern in a layer to be formed using the mask, wherein said pattern includes a plurality of features; the method comprising:

identifying cutting areas for phase shift regions based upon characteristics of said pattern;

assigning phase values to phase shift windows in the phase shift regions;

wherein said assigning comprises cutting the phase shift regions in selected ones of the cutting areas to define the phase shift windows; and storing a result of said assigning in a computer readable medium.

2. The method of claim 1, wherein said identifying cutting areas includes:

identifying features in the plurality of features characterized by non-critical process latitude to define a set of features;

identifying fields between features in the plurality of features characterized by critical process latitude to define a set of critical fields; and defining cutting areas as areas within the phase shift regions which extend between two features in the set of features, or between a feature in a set of features and a field outside the phase shift regions, without intersecting a field in the set of critical fields.

3. The method of claim 1, wherein said assigning comprises applying a cost function to determine the selected ones of the cutting areas.

4. The method of claim 1, wherein said assigning includes ranking said cutting areas based upon characteristics of said pattern, and determining the selected ones of the cutting areas based upon said ranking.

5. The method of claim 1, including laying out said phase shift windows in an opaque background.

6. The method of claim 1, including laying out said phase shift windows in a clear background.

7. The method of claim 1, wherein a characteristic of said pattern used in said identifying cutting areas, is that said pattern includes elbow shaped features.

8. The method of claim 1, wherein a characteristic of said pattern used in said identifying cutting areas, is that said pattern includes T-shaped features.

9. The method of claim 1, wherein a characteristic of said pattern used in said identifying cutting areas, is that said pattern includes polygons larger than a particular size.

10. The method of claim 1, wherein said identifying cutting areas includes determining parameters for said identifying using simulations, based upon simulation criteria which tends to flag features characterized by non-critical process latitude.

11. The method of claim 1, wherein said identifying cutting areas includes determining parameters for said identifying using simulations of over-exposure conditions which tends to flag features characterized by non-critical process latitude.

12. The method of claim 1, wherein said identifying cutting areas includes determining parameters for said identifying using simulations, based upon simulation criteria which tends to flag fields between features in said pattern characterized by critical process latitude.

13. The method of claim 1, wherein said identifying cutting areas includes determining parameters for said identifying using simulations of under-exposure conditions which tends to flag fields between features in said pattern characterized by critical process latitude.

14. The method of claim 1, wherein said assigning phase values includes defining a first set of phase shift window inducing $\theta$ degrees phase shifting and a second set of phase shift windows inducing $\phi$ degrees phase shifting.

15. The method of claim 14, wherein $\phi$ is equal to approximately $\theta+180$ degrees.

16. A photolithographic mask for defining a pattern in a layer to be formed using the mask, wherein said pattern includes a plurality of features, and said layer includes fields outside said pattern, comprising:
a substrate;
a mask layer of material on said substrate;
the mask layer including phase shift regions and fields, and a plurality of phase shift windows in the phase shift regions, the plurality of phase shift windows characterized by phase shift values that create phase transitions between the phase shift windows to form said pattern, wherein the wherein the boundaries of the phase shift windows lie within cutting areas that are defined based upon characteristics of said pattern.

17. The mask of claim 16, wherein a set of features in the plurality of features are characterized by non-critical process latitude, and a set of critical fields between features in the plurality of features are characterized by critical process latitude; and
said cutting areas include areas within the phase shift regions which extend between two features in the set of features, or between a feature in the set of features and a field outside the phase shift regions, without intersecting a field in the set of critical fields.

18. The mask of claim 16, wherein the mask layer comprises an opaque material.

19. The mask of claim 16, wherein the mask layer comprises a clear material.

20. The mask of claim 16, wherein a characteristic of said pattern used in defining cutting areas, is that said pattern includes elbow shaped features.

21. The mask of claim 16, wherein a characteristic of said pattern used in defining cutting areas, is that said pattern includes T-shaped features.

22. The mask of claim 16, wherein a characteristic of said pattern used in defining cutting areas, is that said pattern includes polygons larger than a particular size.

23. The mask of claim 16, wherein said phase shift values include $\theta$ degrees phase shifting and $\phi$ degrees phase shifting, wherein $\phi$ is equal to approximately $\theta+180$ degrees.

24. A method for manufacturing a photolithographic mask that defines a pattern in a layer to be formed using the mask, wherein said pattern includes a plurality of features; the method comprising:
identifying cutting areas for phase shift regions based upon characteristics of said pattern;
assigning phase values to phase shift windows in the phase shift regions;
wherein said assigning comprises cutting the phase shift regions in selected ones of the cutting areas to define the phase shift windows; and
applying a result and said assigning to formation of a mask layer on a substrate.

25. The method of claim 24, wherein said identifying cutting areas includes:
identifying features in the plurality of features characterized by non-critical process latitude to define a set of features;
identifying fields between features in the plurality of features characterized by critical process latitude to define a set of critical fields; and
defining cutting areas as areas within the phase shift regions which extend between two features in the set of features, or between a feature in a set of features and a field outside the phase shift regions, without intersecting a field in the set of critical fields.

26. The method of claim 24, wherein said assigning comprises applying a cost function to determine the selected ones of the cutting areas.

27. The method of claim 24, wherein said assigning includes ranking said cutting areas based upon characteristics of said pattern, and determining the selected ones of the cutting areas based upon said ranking.

28. The method of claim 24, including laying out said phase shift windows in an opaque background.

29. The method of claim 24, including laying out said phase shift windows in a clear background.

30. The method of claim 24, wherein a characteristic of said pattern used in said identifying cutting areas, is that said pattern includes elbow shaped features.

31. The method of claim 24, wherein a characteristic of said pattern used in said identifying cutting areas, is that said pattern includes T-shaped features.

32. The method of claim 24, wherein a characteristic of said pattern used in said identifying cutting areas, is that said pattern includes polygons larger than a particular size.

33. The method of claim 24, wherein said identifying cutting areas includes determining parameters for said identifying using simulations, based upon simulation criteria which tends to flag features characterized by non-critical process latitude.

34. The method of claim 24, wherein said identifying cutting areas includes determining parameters for said identifying using simulations of over-exposure conditions which tends to flag features characterized by non-critical process latitude.

35. The method of claim 24, wherein said identifying cutting areas includes determining parameters for said identifying using simulations, based upon simulation criteria which tends to flag fields between features in said pattern characterized by critical process latitude.

36. The method of claim 24, wherein said identifying cutting areas includes determining parameters for said identifying using simulations of under-exposure conditions which tends to flag fields between features in said pattern characterized by critical process latitude.

37. The method of claim 24, wherein said assigning phase values includes defining a first set of phase shift window inducing θ degrees phase shifting and a second set of phase shift windows inducing φ degrees phase shifting.

38. The method of claim 37, wherein φ is equal to approximately θ+180 degrees.

39. A method of generating a phase shifted representation of a layer of an integrated circuit, the method comprising:

selecting a plurality of structures in a first layer representation of the integrated circuit for definition using a phase shift representation;

defining a plurality of phase shift regions in the phase shift representation for use in defining the plurality of structures;

identifying a plurality of cutting areas in the plurality of phase shift regions, the plurality of cutting areas indicating locations where a phase shift region in the plurality of phase shift regions can be divided into phase shift windows;

ranking the plurality of cutting areas;

identifying, and assigning phase values to, phase shift windows in the phase shift representation by selectively using the plurality of cutting areas and the ranking to resolve phase conflicts; and generating a second representation of the first layer representation for use in conjunction with the phase shifting region.

40. The method of claim 39, wherein the second representation comprises a binary trim mask representation for protecting the plurality of structures defined by the phase shift representation and defining other structures in the first layer representation.

41. The method of claim 39, wherein the second representation comprises an attenuated binary trim mask representation.

42. The method of claim 39, wherein the ranking comprises treating each of the plurality of cutting areas as equally ranked.

43. The method of claim 39, wherein the plurality of cutting areas includes a first cutting area and a second cutting area, and wherein the first cutting area ranked as preferred over the second cutting area for selection during the assigning.

44. The method of claim 43, wherein the first cutting area comprises a cut to field and the second cutting area comprises a cut around a contact hole.

45. The method of claim 39, wherein the first layer representation comprises a second plurality of structures and wherein the selecting comprises selecting as the plurality of structures substantially all of the structures in the second plurality of structures.

46. The method of claim 39, wherein the assigning further comprises:

using each of the plurality of cutting areas to divide the plurality of phase shift regions into a plurality of phase shift windows;

assigning phase to each of the plurality of phase shift windows; and selectively merging phase shift windows in the plurality of windows to reduce number of phase shift windows using the ranking.

47. The method of claim 39, wherein the assigning further comprises:

representing the plurality of phase shift regions and plurality of cutting areas using a graph data structure, the graph data structure representing the ranking and phase conflicts;

determining phase assignments using the graph data structure.

48. The method of claim 47, wherein the determining phase assignments further comprises identifying phase conflicts as cycles of odd length in the graph data structure.

* * * * *